US 9,813,628 B2

(12) United States Patent
Iwasaki

(10) Patent No.: US 9,813,628 B2
(45) Date of Patent: Nov. 7, 2017

(54) IMAGING MODULE AND ELECTRONIC DEVICE

(71) Applicant: FUJIFILM Corporation, Tokyo (JP)

(72) Inventor: Tatsuro Iwasaki, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/188,434

(22) Filed: Jun. 21, 2016

(65) Prior Publication Data
US 2016/0301875 A1 Oct. 13, 2016

Related U.S. Application Data

(63) Continuation of application No. PCT/JP2014/084303, filed on Dec. 25, 2014.

(30) Foreign Application Priority Data

Feb. 12, 2014 (JP) .................................. 2014-024498

(51) Int. Cl.
*H04N 5/225* (2006.01)
*H04N 5/232* (2006.01)
(Continued)

(52) U.S. Cl.
CPC ........... *H04N 5/23287* (2013.01); *G02B 7/09* (2013.01); *G02B 27/646* (2013.01); *G03B 5/02* (2013.01);
(Continued)

(58) Field of Classification Search
CPC .... H04N 5/232; H04N 5/225; H04N 5/23287; H04N 5/2254; G03B 2205/0007;
(Continued)

(56) References Cited

U.S. PATENT DOCUMENTS 9,041,818 B2 * 5/2015 Takahashi .......... H04N 5/23287
348/208.7
9,432,580 B2 * 8/2016 Shimizu ................... G03B 5/00
(Continued)

FOREIGN PATENT DOCUMENTS

JP 2009-71495 A 4/2009
JP 2009-198692 A 9/2009
(Continued)

OTHER PUBLICATIONS

International Search Report for PCT/JP2014/084303 dated Apr. 7, 2015.
(Continued)

*Primary Examiner* — Ngoc-Yen Vu
(74) *Attorney, Agent, or Firm* — Birch, Stewart, Kolasch & Birch, LLP

(57) ABSTRACT

An imaging module includes an image stabilizing movable portion which has a lens group and a magnetic member, an imaging element which images a subject through the lens group, an elastic support portion which supports the image stabilizing movable portion so as to be movable in a direction perpendicular to an optical axis of the lens group and to be inclinable around an axis perpendicular to the optical axis, and a suppression portion which mechanically prevents inclination of the image stabilizing movable portion, in which the suppression portion has an extension portion which is provided in the image stabilizing movable portion and extends in an outer circumferential direction of the image stabilizing movable portion, and a guide portion which overlaps the extension portion when viewed from the direction of the optical axis, and prevents inclination of the image stabilizing movable portion by abutting the extension portion.

20 Claims, 17 Drawing Sheets

(51) Int. Cl.
*G03B 5/02* (2006.01)
*G02B 7/09* (2006.01)
*G02B 27/64* (2006.01)
*H01L 31/0203* (2014.01)
*H01L 31/0232* (2014.01)

(52) U.S. Cl.
CPC ... *H04N 5/2254* (2013.01); *G03B 2205/0015* (2013.01); *H01L 31/0232* (2013.01); *H01L 31/02325* (2013.01)

(58) Field of Classification Search
CPC .... G03B 2205/0015; G03B 2205/0023; G03B 2205/0038; H01L 31/0232; H01L 31/048; H01L 31/054; H01L 31/02325
USPC .................................. 348/374; 257/433–434
See application file for complete search history.

(56) References Cited

U.S. PATENT DOCUMENTS

| | | | |
|---|---|---|---|
| 9,459,464 B2 * | 10/2016 | Minamisawa | G02B 7/08 |
| 9,681,034 B2 * | 6/2017 | Hsu | H04N 5/2257 |
| 2009/0067827 A1 | 3/2009 | Yoshida et al. | |
| 2013/0076924 A1 * | 3/2013 | Wade | G03B 5/02 |
| | | | 348/208.11 |
| 2013/0201559 A1 | 8/2013 | Minamisawa et al. | |
| 2015/0348688 A1 * | 12/2015 | Yanagisawa | H01F 5/02 |
| | | | 335/297 |

FOREIGN PATENT DOCUMENTS

| | | |
|---|---|---|
| JP | 2009-300766 A | 12/2009 |
| JP | 2010-128385 A | 6/2010 |
| JP | 2011-133702 A | 7/2011 |
| JP | 2013-122575 A | 6/2013 |

OTHER PUBLICATIONS

Written Opinion of the International Searching Authority for PCT/JP2014/084303 dated Apr. 7, 2015.

\* cited by examiner

FIG. 5A
INCLINATION IS NOT PREVENTED
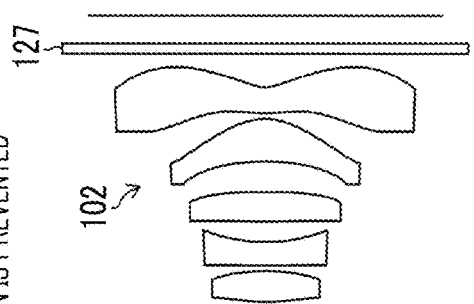
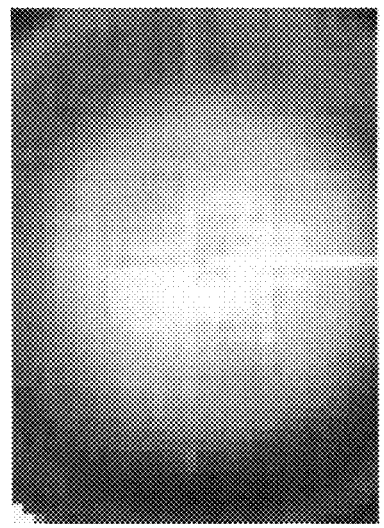
RESOLUTION OF PLANE IS DISPERSED DUE TO INCLINATION
FIG. 5B
INCLINATION IS PREVENTED
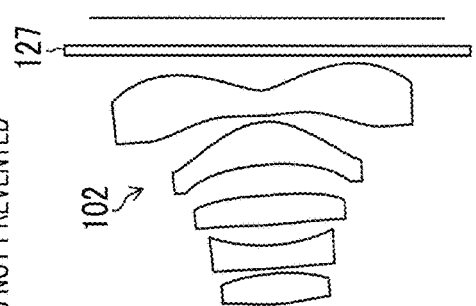
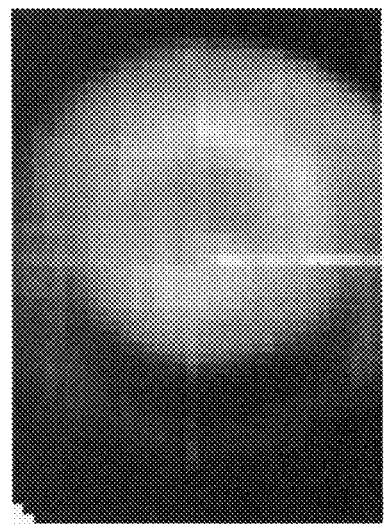
EVENNESS OF RESOLUTION IS IMPROVED DUE TO PREVENTION OF INCLINATION

IMAGING MODULE AND ELECTRONIC DEVICE

CROSS-REFERENCE TO RELATED APPLICATIONS

This application is a Continuation of PCT International Application No. PCT/JP2014/084303 filed on Dec. 25, 2014, which claims priority under 35 U.S.C. §119(a) to Japanese Patent Application No. 2014-24498 filed on Feb. 12, 2014. Each of the above applications is hereby expressly incorporated by reference, in their entirety, into the present application.

BACKGROUND OF THE INVENTION

1. Field of the Invention

The present invention relates to an imaging module and an electronic device, and particularly, to an imaging module having an optical image stabilizer (OIS) function which is mounted on an electronic device such as a smart phone, a portable phone, or a tablet terminal, and an electronic device having the imaging module.

2. Description of the Related Art

FIG. 15 is a schematic view showing an internal configuration of an imaging module 1 having an optical image stabilizer (OIS) function in the related art.

The imaging module 1 mainly comprises a tubular lens barrel 12 which supports a lens group 10, an image stabilizing movable portion 20 which accommodates the lens barrel 12 and has a magnetic member such as a magnet 54, an imaging element 30, an elastic support portion 40 which supports the image stabilizing movable portion 20 so as to be movable in a direction perpendicular to an optical axis of the lens group 10 and to be inclinable around an axis perpendicular to the optical axis, an OIS mechanism 50 which moves the image stabilizing movable portion 20 in a direction orthogonal to the optical axis (in a XY plane), and an focus adjustment mechanism 60 which moves the lens barrel 12 in a direction (Z direction) of the optical axis.

The elastic support portion 40 is configured of a plate spring 42 which extends to the side of the image stabilizing movable portion 20, and four suspension wires 44 of which one end is fixed to the plate spring 42 and the other end is fixed to the imaging element 30 side.

The OIS mechanism 50 is configured of a voice coil motor which is consisted of an OIS drive coil 52 which is fixed to a substrate 32 side (fixed side) on which the imaging element 30 is disposed, and an OIS drive magnet 54 which is fixed to the image stabilizing movable portion 20 side (movable side) and is a magnetic member. In addition, in FIG. 15, a pair of OIS drive coils 52 and a pair of OIS drive magnets 54 are shown in an X direction (a right-left direction in FIG. 15). However, a pair of OIS drive coils 52 and a pair of OIS drive magnets 54 are also provided in the Y direction (a direction orthogonal to a paper surface of FIG. 15). By driving the OIS drive coils in the X direction and the Y direction and moving the image stabilizing movable portion 20 in the direction orthogonal to the optical axis (in the XY plane), it is possible to perform image stabilization.

The focus adjustment mechanism 60 is configured of a voice coil motor which is consisted of an auto focus (AF) coil 62 which is disposed inside the image stabilizing movable portion 20 and an AF magnet 64 which is disposed around the lens barrel 12. By driving the voice coil motor and moving the lens barrel 12 in the direction (Z direction) of the optical axis, it is possible to perform focus adjustment.

The image stabilizing movable portion 20 is disposed (such that the optical axis of the lens group 10 is orthogonal to a light receiving surface of the imaging element 30) so as to directly face the imaging element 30 if possible. However, the imaging module 1 comprising the elastic support portion 40 and the OIS mechanism 50 is influenced by a magnetic field generated from an electronic device on which the imaging module 1 is mounted.

FIG. 16 is a main sectional view of a smart phone 2 in a case where the imaging module 1 is mounted on the smart phone 2. As shown in FIG. 16, a speaker 3 is disposed in the vicinity of the imaging module 1, the imaging module 1 is influenced by a magnetic field (magnetic force) generated by the speaker 3, and as shown in FIG. 17, the image stabilizing movable portion 20 is inclined, and there is a problem that the image stabilizing movable portion 20 does not directly face the imaging element 30.

JP2013-122575A discloses that an image stabilizer is covered by a shield cover, and particularly, in the invention disclosed in JP2013-122575A, a camera cover is not configured of a non-magnetic body but is configured of a magnetic body. In this way, unlike a case where the camera cover is configured of a non-magnetic body, since the camera cover is configured of a magnetic body, a first resonance frequency of a vibration system in an OIS direction is low, a servo gain of a low band increases, and it is possible to increase effects for preventing camera shake.

In addition, JP2009-71495A discloses that in a case where a magnetic force of a speaker which is a magnetic field generation portion is 100 Gauss, a reliable operation of a camera module is ensured if the camera module is separated from a speaker by 10 mm or more.

SUMMARY OF THE INVENTION

In JP2013-122575A, if a magnetic body exists in the vicinity of a camera module, since a movable portion is displaced by influences of the magnetic body, even though the camera module is covered by a shield cover, shield effects are dependent on a material, a thickness, or the like of a material used in the shield, and shield effects with respect to a static magnetic field are low.

In addition, in the invention disclosed in JP2009-71495A, in general, an imaging module is disposed so as to be separated from a magnetic field generation portion in an electronic device. However, due to design, a space, or the like of the electronic device, there is a case where the imaging module should be displaced in the vicinity of the magnetic field generation portion in the electronic device, and in this case, there is a problem that the imaging stabilizing movable portion is inclined due to the influences of a magnetic field.

The present invention is made in consideration of the above-described circumstances, and an object thereof is to provide an imaging module and an electronic device capable of allowing an image stabilizing movable portion not to be inclined even though the imaging module is disposed in the vicinity of a magnetic field generation portion in the electronic device, and of improving evenness of resolution of a captured image surface.

In order to achieve the above-described object, according to an embodiment of the present invention, there is provided an imaging module, comprising: an imaging stabilizing movable portion which has a lens group and a magnetic member; an imaging element which images a subject through the lens group; an elastic support portion which supports the image stabilizing movable portion so as to be movable in a direction perpendicular to an optical axis of the lens group and to be inclinable around an axis perpendicular to the optical axis; and a suppression portion which mechanically prevents inclination of the image stabilizing movable portion, in which the suppression portion has an extension portion which is provided in the image stabilizing movable portion and extends in an outer circumferential direction of the image stabilizing movable portion, and a guide portion which overlaps the extension portion when viewed from the direction of the optical axis, and prevents inclination of the image stabilizing movable portion by coming into contact with the extension portion.

According to the embodiment of the present invention, when the imaging module is mounted on an electronic device, even though the image stabilizing movable portion having the magnetic member is subjected to a magnetic field (a magnetic force which inclines the image stabilizing movable portion) from a magnetic field generation portion of the electronic device, since the extension portion extending in the outer circumferential direction of the image stabilizing movable portion comes into contact with the guide portion, it is possible to prevent the inclination of the image stabilizing movable portion. Accordingly, it is possible to improve evenness of resolution of an imaged image surface.

In an imaging module according to another embodiment of the present invention, preferably, the amount of overlap between the extension portion and the guide portion when viewed from the direction of the optical axis has a size which is overlapped therebetween even when the image stabilizing movable portion moves by the maximum movement amount. Accordingly, it is possible to always prevent the inclination during an image stabilizing operation, and it is possible to prevent the extension portion of the image stabilizing movable portion from falling from the guide portion.

In an imaging module according to still another embodiment of the present invention, preferably, the extension portions and the guide portions are provided at three locations or more. By providing the extension portions and the guide portions at three locations or more, it is possible to prevent inclinations in all directions (inclinations around two axes perpendicular to the optical axis) of the image stabilizing movable portion.

In an imaging module according to still another embodiment of the present invention, preferably, the guide portions are provided on both of the subject side and the imaging element side of the extension portion. Accordingly, it is possible to prevent the inclination of the extension portion (that is, the inclination of the image stabilizing movable portion) in a state where the extension portion is interposed between the guide portions, and it is possible to decrease the number of the installed extension portions and the guide portions.

In an imaging module according to still another embodiment of the present invention, preferably, the extension portions are provided on both of the subject side and the imaging element side of the guide portion. Accordingly, it is possible to prevent the inclination of the extension portion (that is, the inclination of the image stabilizing movable portion) in a state where the guide portion is interposed between the extension portions, and it is possible to decrease the number of the installed extension portions and the guide portions.

In an imaging module according to still another embodiment of the present invention, preferably, the extension portion and the guide portion normally come into contact with each other in a state where the image stabilizing movable portion is driven. Accordingly, it is possible to make the inclination of the image stabilizing movable portion be 0.

In an imaging module according to still another embodiment of the present invention, preferably, a low-friction coating is applied to at least one surface of contact surfaces on which the extension portion and the guide portion come into contact with each other. It is possible to decrease electric power required for driving of the image stabilization when the extension portion and the guide portion come into contact to slide with each other.

In an imaging module according to still another embodiment of the present invention, preferably, the image stabilizing movable portion has a voice coil motor which drives the lens group in the direction of the optical axis. Accordingly, the lens group moves in the direction of the optical axis, and it is possible to perform focus adjustment. In addition, a state where the imaging stabilizing movable portion is driven means a state where current flows to the voice coil motor, and the state also includes a state where a positional relationship between a magnet and a coil is not changed.

In an imaging module according to still another embodiment of the present invention, preferably, the electronic support portion is configured of a plate spring which extends to the side of the image stabilizing movable portion, and three or more suspension wires of which one end is fixed to the plate spring and the other end is fixed to the imaging element side.

In an imaging module according to still another embodiment of the present invention, preferably, a pixel pitch of the imaging element is 1 µm or less. If the pixel pitch of the image element decreases, a radius of an allowable circle of confusion decreases, and a focal depth decreases. Accordingly, if the pixel pitch is 1 µm or less, it is necessary to directly face the lens group and the imaging element with high accuracy.

According to still another embodiment of the present invention, there is provided an electronic device comprising the imaging module mounted thereon.

In an electronic device according to still another embodiment of the present invention, the electronic device has a magnetic field generation portion which generates a magnetic field by which the image stabilizing movable portion is inclined.

According to the present invention, even though the imaging module is disposed in the vicinity of the magnetic field generation portion inside the electronic device and the image stabilizing movable portion is subjected to the magnetic field (magnetic force) by which the image stabilizing movable portion is inclined from the magnetic field generation portion, since the extension portion extending in the outer circumferential direction of the image stabilizing movable portion abuts the guide portion, it is possible to prevent inclination of the image stabilizing movable portion, and it is possible to improve evenness of resolution of an imaged image surface.

BRIEF DESCRIPTION OF THE DRAWINGS

FIG. 5A is a view showing a relationship of a lens group and an imaging element unit of an imaging module of the related art, and distribution of resolution of a screen of an imaging element, and FIG. 5B is a view showing a relationship of a lens group and an imaging element unit of an imaging module of the present invention, and distribution of resolution of a screen of an imaging element.

DESCRIPTION OF THE PREFERRED EMBODIMENTS

Hereinafter, embodiments of an imaging module and an electric device according to the present invention will be described with reference to the accompanying drawings.

<Appearance of Imaging Module>

Figure 1:
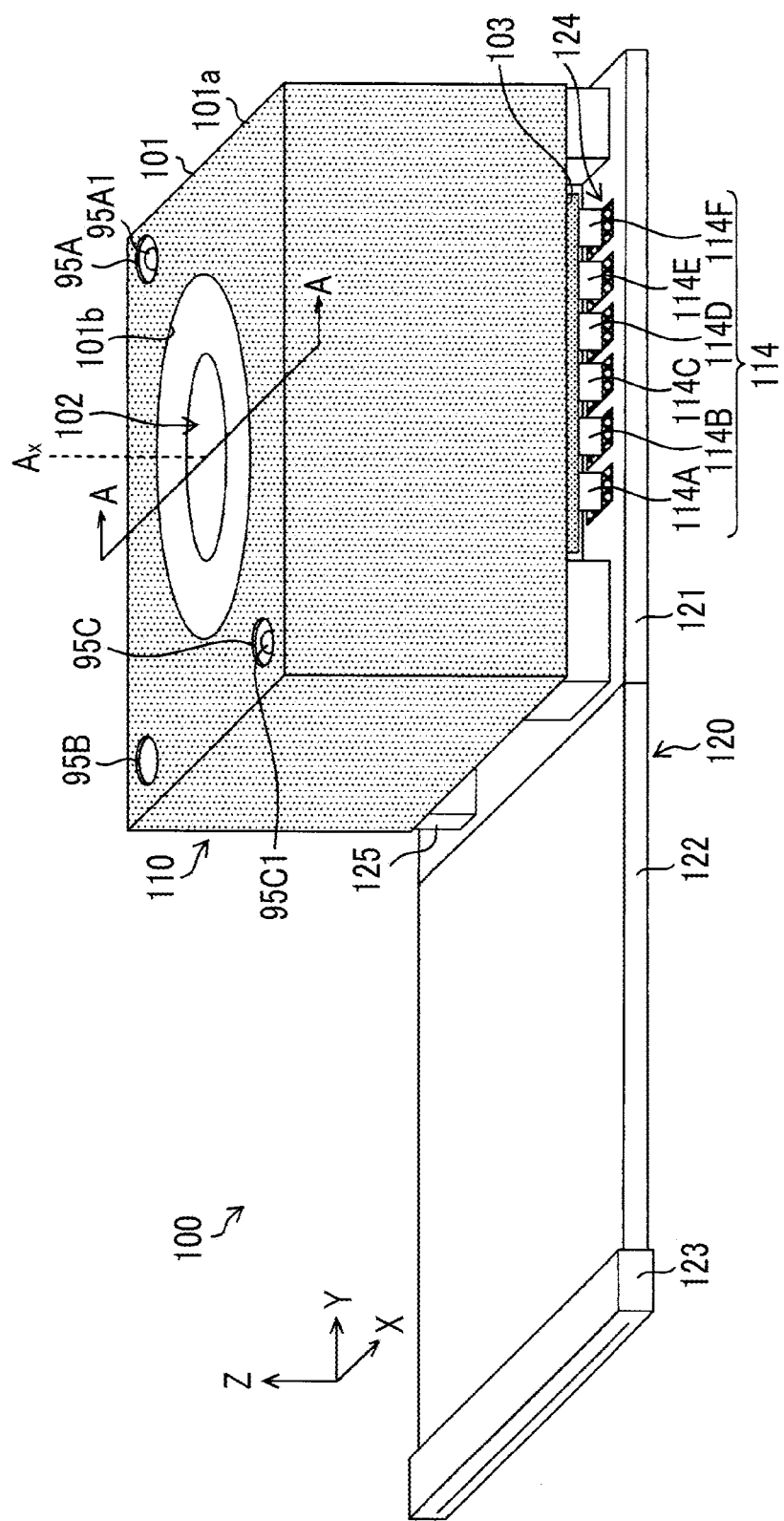
FIG. 1 is an external perspective view of an imaging module.

FIG. 1 is an external perspective view of an imaging module 100 according to the present invention.

The imaging module 100 comprises a lens unit 110 which has a lens group 102, and an imaging element unit 120 which has an imaging element (not shown in FIG. 1) which images a subject through the lens group 102.

In FIG. 1, a direction along an optical axis Ax of the lens group 102 is defined as a Z direction, and two directions which are orthogonal to the Z direction and are orthogonal to each other are defined as an X direction and a Y direction, respectively.

The lens unit 110 comprises a housing 101 in which components described below are accommodated.

An opening 101b which has the optical axis Ax of the lens group 102 as the center is formed on a top surface 101a of the housing 101. The imaging module 100 receives light of a subject through the lens group 102 from the opening 101b, and performs imaging.

In addition, positioning concave sections 95A, 95B, and 95C for holding the lens unit 110 to a manufacturing apparatus when the imaging module 100 is manufactured are formed on the top surface 101a of the housing 101. Concave sections 95A1 and 95C1 which are smaller than the concave sections 95A and 95C are formed on bottom surfaces of the concave sections 95A and 95C positioned on a diagonal line on the top surface 101a.

A portion of a flexible substrate 103 accommodated in the housing 101 is exposed outside the housing 101. A lens unit terminal portion 114 including terminals 114A to 114F is connected to the distal end of the exposed portion of the flexible substrate 103. The lens unit terminal portion 114 is exposed from a surface except for the top surface 101a which is the surface orthogonal to the Z direction, among surfaces configuring the housing 101.

In addition, as described below, the lens unit terminal portion 114 includes other terminals in addition to the terminals 114A to 114F. However, in FIG. 1, for simplification, only the terminals 114A to 114F are shown, and other terminals are not shown.

Figure 2:
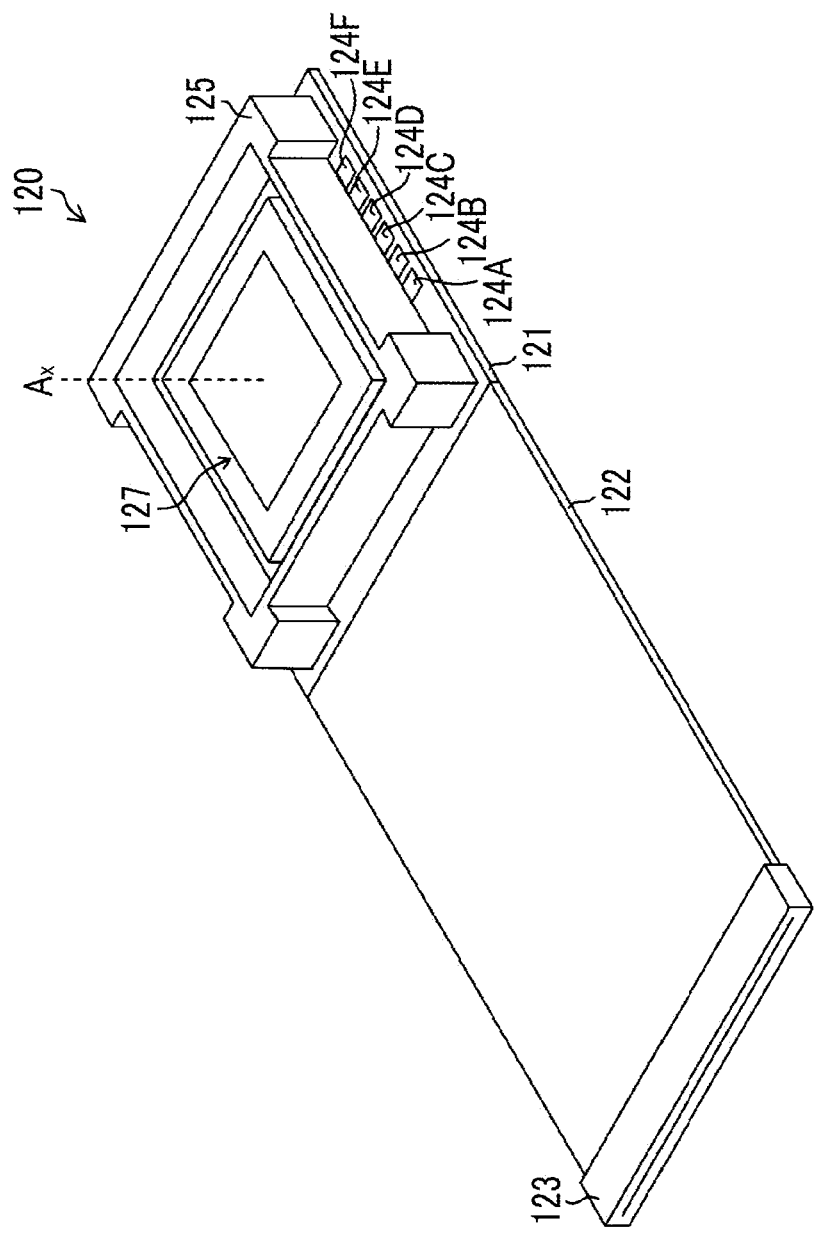
FIG. 2 is an external perspective view of the imaging element unit in a state where a lens unit is omitted in the imaging module shown in FIG. 1.

FIG. 2 is an external perspective view showing a state where the lens unit 110 is omitted in the imaging module 100 shown in FIG. 1.

As shown in FIG. 2, the imaging element unit 120 comprises a substrate 121 on which an imaging element 127 such as a CCD (charge coupled device) image sensor or a CMOS (complementary metal oxide semiconductor) image sensor is formed, and a flexible substrate 122 which is electrically connected to the substrate 121.

A pixel pitch of the imaging element 127 is not particularly limited. However, an imaging element having a pixel pitch of 1.0 μm or less is used as the imaging element 127. Here, the pixel pitch means the minimum distance among distances between centers of photoelectrically converted regions included in pixels provided in the imaging element 127.

In recent years, the pixel pitch of the imaging element has decreased according to an increase of the number of pixels. However, if the pixel pitch decreases, an area per pixel decreases. Accordingly, a radius of an allowable circle of confusion decreases, and a focal depth decreases. In addition, since it is necessary to increase a condensed light amount per pixel, an F-number of the lens is likely to be decreased.

Accordingly, in recent years, since the focal depth of the imaging module is very small, it is necessary to perform positioning of the lens unit and the imaging element unit with high accuracy. Particularly, if the pixel pitch is 1 μm or less, high positioning accuracy is required.

A tubular base member 125 having an opening corresponding to the imaging element 127 is disposed on the substrate 121, and the imaging element 127 is disposed inside the base member 125. A cover glass (not shown) is fitted to the upper portion of the imaging element 127 in a hollow portion of the base member 125.

An imaging element unit terminal portion 124 including terminals 124A to 124F for electrically connecting to the lens unit 110 is provided on the surface of the substrate 121 on the outside of the base member 125. Similarly to the lens unit terminal portion 114, in the imaging element unit terminal portion 124, only some terminals are shown.

An imaging element wire, which is connected to a data output terminal, a drive terminal, or the like of the imaging element 127, is provided on the substrate 121. The imaging element wire is connected to an external connection terminal portion 123, which is provided on the end portion of the flexible substrate 122, via a wire provided on the flexible substrate 122. The external connection terminal portion 123 functions as an electric connection portion which is electrically connected to the imaging element 127.

In addition, a lens unit wire, which is connected to each terminal included in the imaging element unit terminal portion 124, is provided on the substrate 121. The lens unit wire is connected to the external connection terminal portion 123, which is provided on the end portion of the flexible substrate 122, via the wire provided on the flexible substrate 122.

In a state where the lens unit 110 and the imaging element unit 120 are fixed, each terminal of the lens unit terminal portion 114 and each terminal of the imaging element unit terminal portion 124 corresponding to each terminal of the lens unit terminal portion are electrically connected to each other.

In FIG. 1, the terminal 114A and the terminal 124A are electrically connected to each other, the terminal 114B and the terminal 124B are electrically connected to each other, the terminal 114C and the terminal 124C are electrically connected to each other, the terminal 114D and the terminal 124D are electrically connected to each other, the terminal 114E and the terminal 124E are electrically connected to each other, and the terminal 114F and the terminal 124F are electrically connected to each other.

Figure 3:
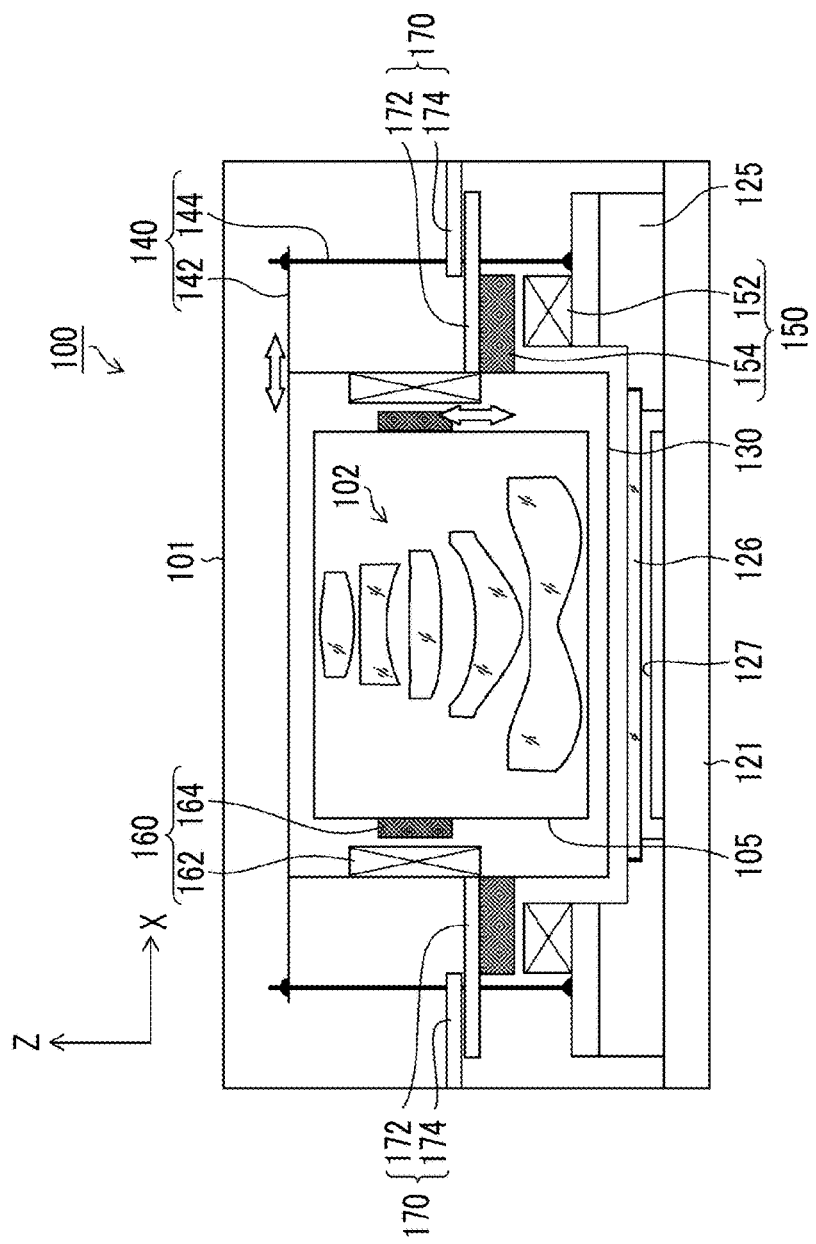
FIG. 3 is a sectional view taken along line A-A of the imaging module shown in FIG. 1.

FIG. 3 is a sectional view taken along line A-A of the imaging module 100 shown in FIG. 1.

As shown in FIG. 3, the imaging element 127 is mounted on the substrate 121, and is sealed by the base member 125 provided on the substrate 121 and the cover glass 126 fitted to the base member 125.

Moreover, the lens unit 110 comprises the lens group 102 which includes a plurality of (five in the example of FIG. 3) lenses disposed above the cover glass 126, a tubular lens barrel 105 which supports the lens group 102, an image stabilizing movable portion 130, an elastic support portion 140 which supports the image stabilizing movable portion 130 so as to be movable in a direction perpendicular to an optical axis of the lens group 102 and to be inclinable around an axis perpendicular to the optical axis, an OIS mechanism 150 which moves the image stabilizing movable portion 130 in the direction orthogonal to the optical axis, and a focus adjustment mechanism 160 which moves the lens barrel 105 in the direction of the optical axis.

The elastic support portion 140 is configured of a plate spring 142 which extends to the side of the image stabilizing movable portion 130, and four suspension wires 144 of which one end is fixed to the plate spring 142 and the other end is fixed to the base member 125 side.

The OIS mechanism 150 is configured of an OIS drive coil 152 which is fixed to the base member 125 side (fixed side), and a voice coil motor consisted of an OIS drive magnet 154 which is fixed to the image stabilizing movable portion 130 side (movable side).

Figure 15:
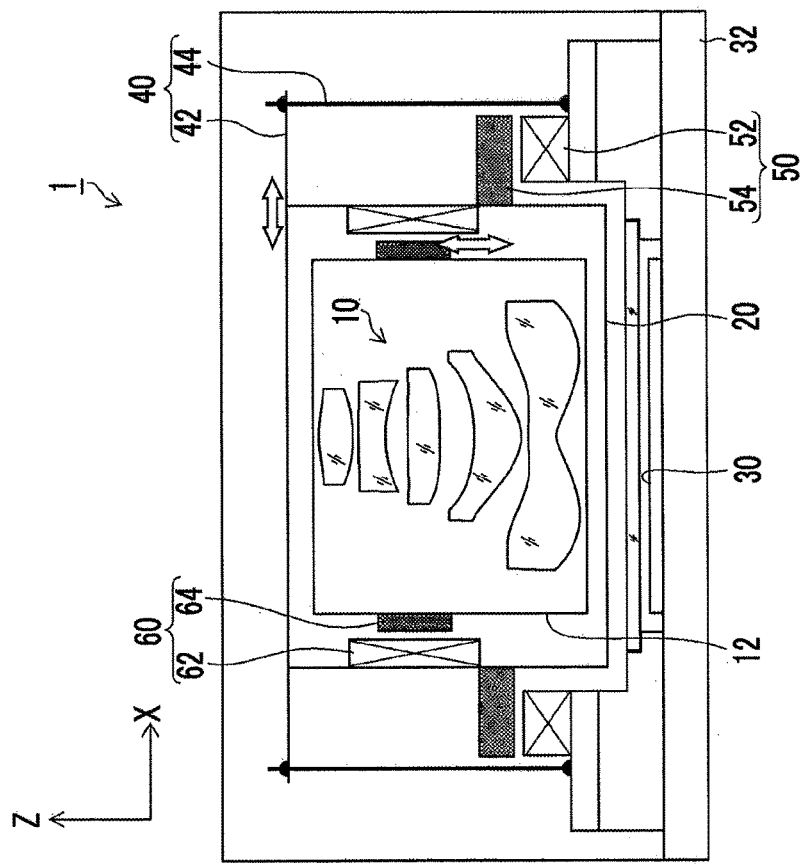
FIG. 15 is a schematic view showing an internal configuration of an imaging module having an OIS function of the related art.
Figure 16:
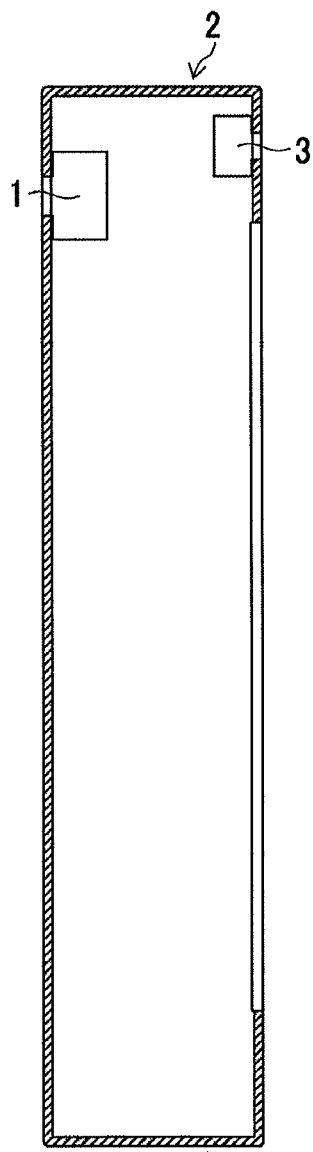
FIG. 16 is a main sectional view of the smart phone in a case where the imaging module is mounted on the smart phone.
Figure 17:
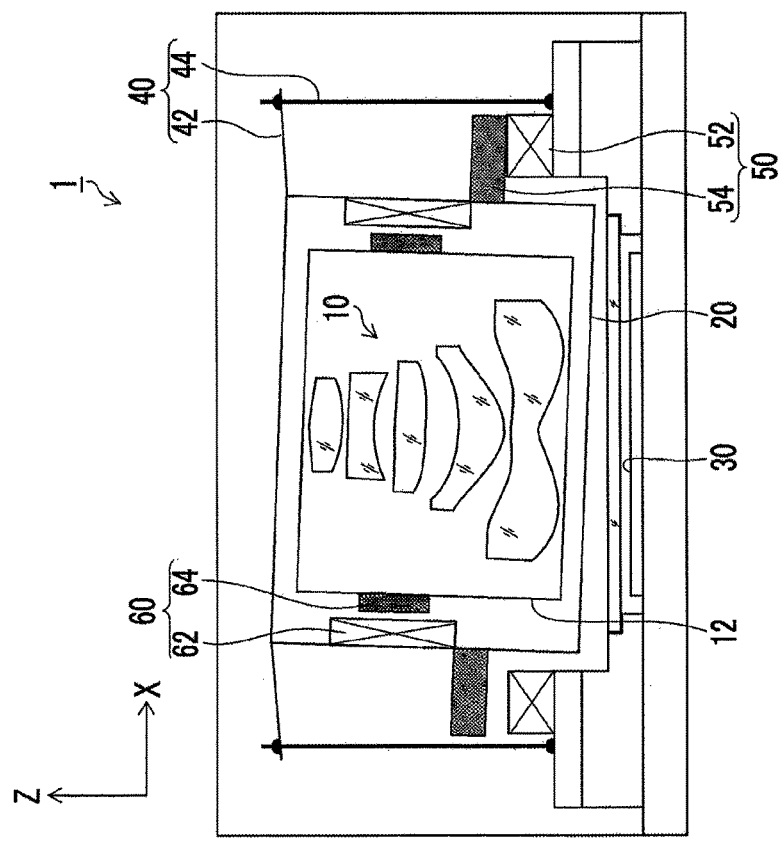
FIG. 17 is a schematic view showing the internal configuration of the imaging module having the OIS function of the related art, and is a view showing a state where an image stabilizing movable portion is inclined due to influences of a magnetic field (magnetic force).

In addition, in FIG. 3, a pair of OIS drive coils 152 and a pair of OIS drive magnets 154 are shown in an X direction (a right-left direction in FIG. 15) of a three-axis orthogonal coordinate system with the direction of the optical axis of the lens group 102 as the Z axis. However, a pair of OIS drive coils and a pair of OIS drive magnets are also provided in the Y direction (a direction orthogonal to a paper surface of FIG. 15). By driving the OIS drive coils in the X direction and the Y direction and moving the image stabilizing movable portion 130 in the direction orthogonal to the optical axis (in the XY plane), it is possible to perform image stabilization.

The focus adjustment mechanism 160 is configured of a voice coil motor which is consisted of an auto focus (AF) coil 162 which is disposed inside the image stabilizing movable portion 130 and an AF magnet 164 which is disposed around the lens barrel 105. By driving the voice coil motor and moving the lens barrel 105 in the direction (Z direction) of the optical axis, it is possible to perform focus adjustment.

In addition, the OIS mechanism 150 and the focus adjustment mechanism 160 comprise hall elements (not shown) which are position detection elements which respectively detect the positions in the XYZ axis directions of the lens group 102 (lens barrel 105).

<First Embodiment of Suppression Portion Preventing Inclination of Image Stabilizing Movable Portion>

A suppression portion 170 of a first embodiment mechanically prevents inclination of the image stabilizing movable portion 130, and is configured of an extension portion 172 which is provided on the image stabilizing movable portion 130 side (movable side), and a guide portion 174 which is provided on the housing 101 side (fixed side).

Preferably, the extension portion 172 is a flat surface which extends in an outer circumferential direction of the image stabilizing movable portion 130 and is orthogonal to the direction of the optical axis of the lens group 102.

The guide portion 174 is disposed at a position facing the extension portion 172, and in the present example, in a case where the inclination of the image stabilizing movable portion 130 is 0, the extension portion 172 and the guide portion 174 are provided with a slight gap (a gap corresponding to a range within which the inclination of the image stabilizing movable portion 130 is allowable) therebetween.

Accordingly, in a case where the imaging module 100 is mounted on an electronic device such as a smart phone, the image stabilizing movable portion 130 is subjected to a magnetic field (magnetic force) by which the image stabilizing movable portion 130 is inclined from a magnetic field generation portion (for example, a speaker) inside the electronic device, and the image stabilizing movable portion 130 is inclined beyond the allowable range, the extension portion 172 extending in the outer circumferential direction of the image stabilizing movable portion 130 abuts the guide portion 174. Therefore, it is possible to prevent the image stabilizing movable portion 130 from being inclined beyond the allowable range.

Figure 4:
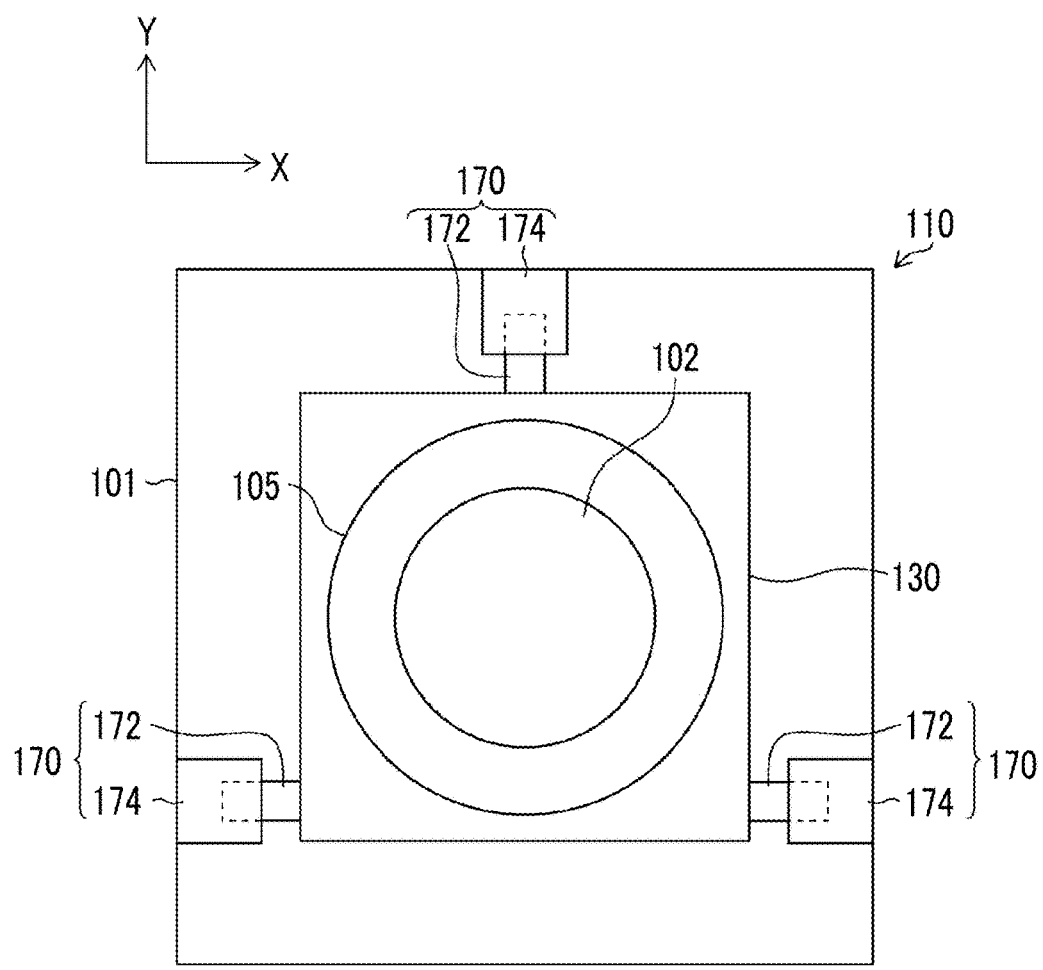
FIG. 4 is a view showing an electric connection configuration inside the lens unit shown in FIG. 2.

FIG. 4 is a plan view of the lens unit 110.

As shown in FIG. 4, the suppression portions 170 (extension portions 172 and guide portions 174) are provided at three locations. According to the suppression portions 170 provided at the three locations, it is possible to prevent the inclination (inclination around two axes perpendicular to the optical axis) in all directions of the image stabilizing movable portion 130.

In addition, preferably, the amount of overlap between the extension portion 172 and the guide portion 174 when viewed from the direction of the optical axis is larger than the maximum movement amount of the image stabilizing movable portion 130. Accordingly, during an image stabilization operation, it is possible to prevent the extension portion 172 of the image stabilizing movable portion 130 side from falling from the guide portion 174.

Moreover, preferably, a low-friction coating is applied to at least one of contact surfaces (surfaces facing each other) of the extension portion 172 and the guide portion 174. As a low-friction coating agent, a well-known material such as a fluororesin, an acetal resin, diamond-like carbon (DLC), or molybdenum may be applied. By applying the low-friction coating to at least one of the contact surfaces of the extension portion 172 and the guide portion 174, it is possible to decrease electric power required for driving of the image stabilization when the extension portion 172 and the guide portion 174 come into contact to slide with each other.

<Comparison Example Between Imaging Module of Related Art and Imaging Module of the Present Invention>

FIG. 5A is a view showing a relationship of a lens group and an imaging element unit of an imaging module of the related art, and distribution of resolution of a screen of an imaging element, and FIG. 5B is a view showing a relationship of a lens group and an imaging element unit of an imaging module 100 of the present invention, and distribution of resolution of a screen of an imaging element.

As shown in FIG. 5A, in the imaging module of the related art, since the suppression portion for preventing inclination of the image stabilizing movable portion is not provided, even though the lens unit and the imaging element unit are adjusted such that the lens group 102 and the imaging element 127 directly face each other with high accuracy, and are bonded and fixed to each other, the image stabilizing movable portion (lens group 102) is inclined due to the magnetic field of the magnetic field generation of the electronic device on which the imaging module is mounted. As a result, the resolution of the screen of the image captured by the imaging element 127 becomes uneven.

Moreover, in FIGS. 5A and 5B, the resolution of the screen is indicated by light and darkness, and becomes brighter, the resolution of the region becomes higher.

Meanwhile, as shown in FIG. 5B, in the imaging module 100 of the present invention, since the suppression portion 170 for preventing inclination of the image stabilizing movable portion 130 is provided, if the lens unit and the imaging element unit are adjusted such that the lens group 102 and the imaging element 127 directly face each other with high accuracy, and are bonded and fixed to each other, even though the image stabilizing movable portion 130 (lens group 102) is subjected to the magnetic field (magnetic force) of the magnetic field generation portion of the electronic device on which the imaging module 100 is mounted, the inclination of the image stabilizing movable portion 130 (lens group 102) is prevented. As a result, it is possible to evenly maintain the resolution of the screen of the image captured by the imaging element 127.

<Electric Connection Configuration of OIS Mechanism 150 and Focus Adjustment Mechanism 160>

Figure 6:
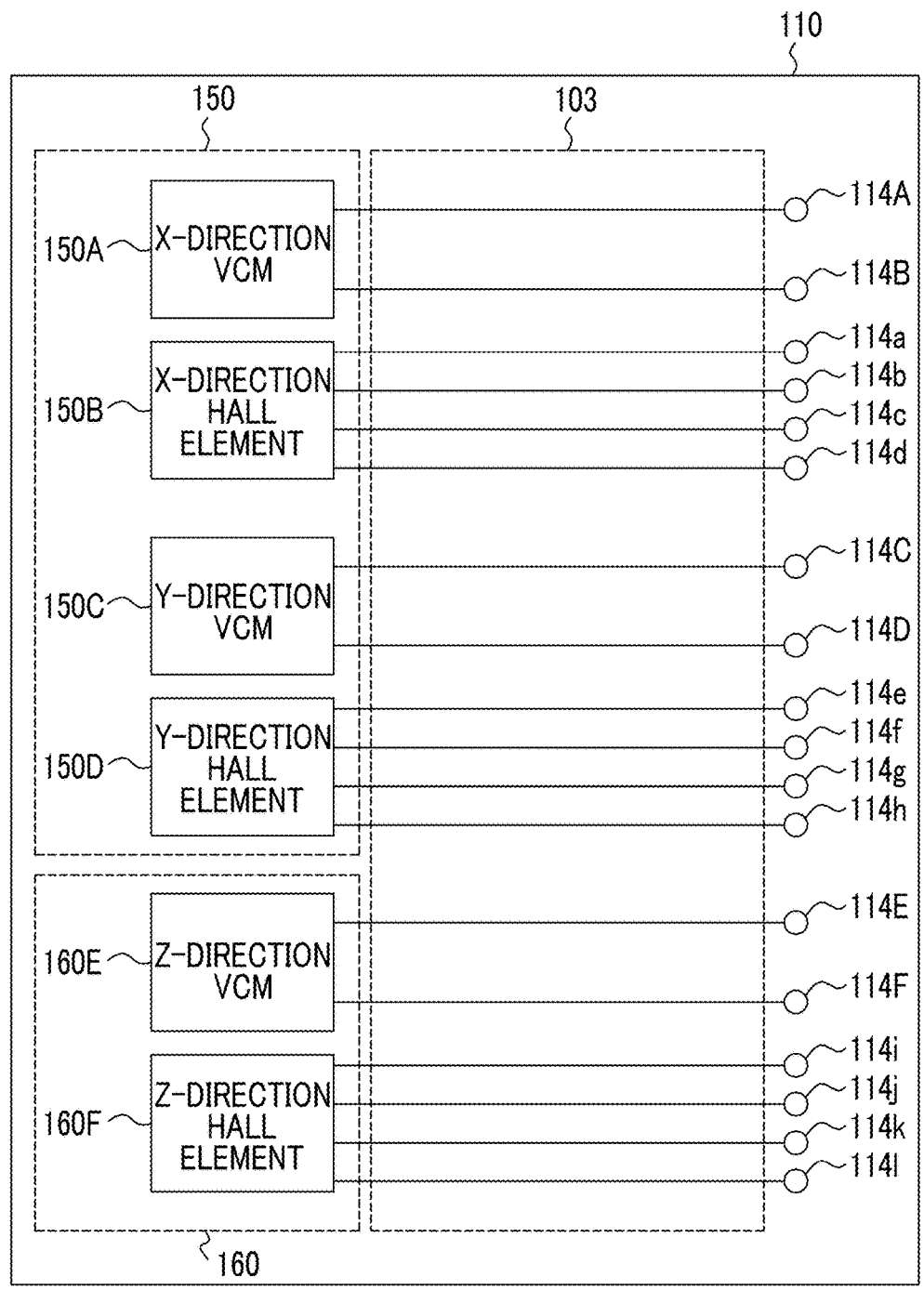
FIG. 6 is a block diagram showing electric connection configurations of an OIS mechanism and a focus adjustment mechanism shown in FIG. 3.

FIG. 6 is a block diagram showing electric connection configurations of the OIS mechanism 150 and the focus adjustment mechanism 160 shown in FIG. 3.

As shown in FIG. 6, the OIS mechanism 150 comprises a voice coil motor 150A (the OIS drive coil 152 and the OIS drive magnet 154 shown in FIG. 3) for moving the image stabilizing movable portion 130 in the X direction, an X-direction hall element 150B for detecting a position of the image stabilizing movable portion 130 in the X direction, a voice coil motor 150C for moving the image stabilizing movable portion 130 in the Y direction, and a Y-direction hall element 150D for detecting a position of the image stabilizing movable portion 130 in the Y direction.

In addition, the focus adjustment mechanism 160 comprises a voice coil motor 160E (the AF coil 162 and the AF magnet 164 shown in FIG. 3) for moving the lens group 102 (lens barrel 105) with respect to the image stabilizing movable portion 130 in the direction (Z direction) of the optical axis, and a Z-direction hall element 160F for detecting a position of the lens barrel 105 in the Z axis direction.

Two terminals are formed on the X-direction VCM 150A, and the two terminals are electrically connected to the terminal 114A and the terminal 114B via wires formed on the flexible substrate 103, respectively.

Four terminals are formed on the X-direction hall element 150B, and the four terminals are electrically connected to a terminal 114$a$, a terminal 114$b$, a terminal 114$c$, and a terminal 114$d$ via wires formed on the flexible substrate 103, respectively.

Two terminals are formed on the Y-direction VCM 150C, and the two terminals are electrically connected to the terminal 114C and the terminal 114D via wires formed on the flexible substrate 103, respectively.

Four terminals are formed on the Y-direction hall element 150D, and the four terminals are electrically connected to a terminal 114$e$, a terminal 114$f$, a terminal 114$g$, and a terminal 114$h$ via wires formed on the flexible substrate 103, respectively.

Two terminals are formed on the Z-direction VCM 160E, and the two terminals are electrically connected to the terminal 114E and the terminal 114F via wires formed on the flexible substrate 103, respectively.

Four terminals are formed on the Z-direction hall element 160F, and the four terminals are electrically connected to a terminal 114$i$, a terminal 114$j$, a terminal 114$k$, and a terminal 114$l$ via wires formed on the flexible substrate 103, respectively.

In this way, each terminal of the lens unit terminal portion 114 functions as an electric connection portion which is electrically connected to the OIS mechanism 150 and the focus adjustment mechanism 60 of the lens unit 110.

In addition, the number of required terminals with respect to the OIS mechanism 150, the focus adjustment mechanism 160, and each hall element is an example, and is not limited to the above-described number.

In the imaging module 100 configured as described above, first, the lens unit 110 and the imaging element unit 120 are separately manufactured. Moreover, in the lens unit 110, even though the image stabilizing movable portion 130 is supported by the elastic support portion 140 so as to be movable in the direction perpendicular to the optical axis of the lens group 102 and to be inclinable around the axis perpendicular to the optical axis, the image stabilizing movable portion 130 is mechanically prevented by the suppression portion 170 consisted of the extension portion 172 and the guide portion 174 from being inclined.

In addition, an adjustment process for positioning the lens unit 110 and the imaging element unit 120 is performed so that an image forming surface of the subject formed by the lens group 102 directly faces an imaging surface of the imaging element 127, and thereafter, the lens unit 110 and the imaging element unit 120 are bonded and fixed to each other.

<Second Embodiment of Suppression Portion Preventing Inclination of Image Stabilizing Movable Portion>

Figure 7:
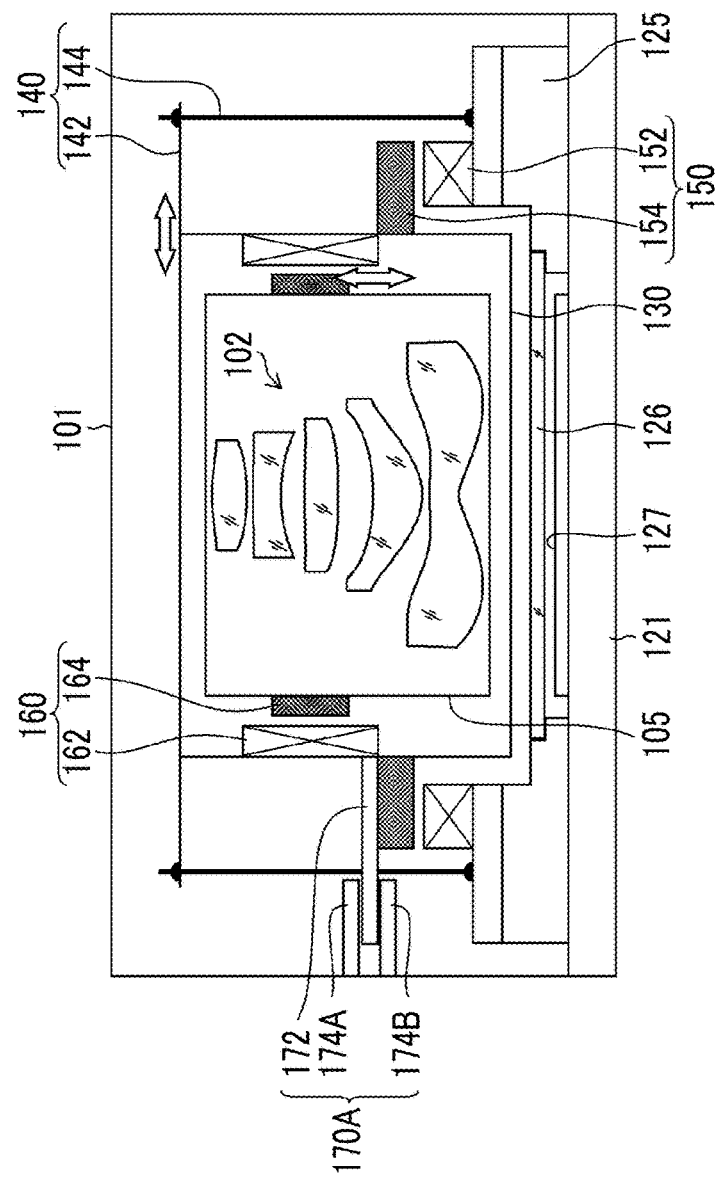
FIG. 7 is a sectional view taken along line A-A of the imaging module shown in FIG. 1, and particularly, is a view showing a second embodiment of a suppression portion which prevents inclination of the image stabilizing movable portion.

FIG. 7 is a sectional view taken along line A-A of the imaging module 100 shown in FIG. 1, and particularly, is a view showing a second embodiment of the suppression portion which prevents the inclination of the image stabilizing movable portion 130. Moreover, in FIG. 7, the same reference numerals are assigned to the portions common to FIG. 3, and detail descriptions thereof are omitted.

A suppression portion 170A of the second embodiment mechanically prevents the inclination of the image stabilizing movable portion 130, and is configured of the extension portion 172 which is provided on the image stabilizing movable portion 130 side (movable side), and guide portions 174A and 174B which are provided on the housing 101 side (fixed side).

Preferably, the extension portion 172 is a flat surface which extends in the outer circumferential direction of the image stabilizing movable portion 130 and is orthogonal to the direction of the optical axis of the lens group 102.

The guide portions 174A and 174B are provided on both of the subject side and the imaging element 127 side of the extension portion 172. An interval between the guide portions 174A and 174B is slightly wider than the thickness of the extension portion 172, and has an interval in which the guide portions 174A and 174B come into contact with the extension portion 172 if the image stabilizing movable portion 130 is inclined beyond the allowable range.

Accordingly, in a case where the imaging module 100 is mounted on an electronic device such as a smart phone, the image stabilizing movable portion 130 is subjected to a magnetic field by which the image stabilizing movable portion 130 is inclined from the magnetic field generation portion inside the electronic device, and the image stabilizing movable portion 130 is inclined beyond the allowable range, the extension portion 172 extending in the outer circumferential direction of the image stabilizing movable portion 130 abuts the guide portions 174A and 174B. Therefore, it is possible to prevent the image stabilizing movable portion 130 from being inclined beyond the allowable range.

In addition, similarly to the suppression portion 170 of the first embodiment shown in FIG. 3, in the suppression portion 170A of the second embodiment, preferably, the amount of overlap between the extension portion 172 and the guide portions 174A and 174B when viewed from the direction of the optical axis is larger than the maximum movement amount of the image stabilizing movable portion 130. Accordingly, during the image stabilization operation, it is possible to prevent the extension portion 172 of the image stabilizing movable portion 130 side from falling from the guide portions 174A and 174B.

Moreover, preferably, low-friction coating is applied to at least one of contact surfaces (surfaces facing each other) of the extension portion 172 and the guide portions 174A and 174B.

As shown in FIG. 4, the suppression portions 170 of the first embodiment are provided at three locations. However, in the suppression portion 170A of the second embodiment, since the inclination of the extension portion 172 (that is, the inclination of the image stabilizing movable portion 130) is prevented in the state where the extension portion 172 is interposed between the guide portions 174A and 174B, the suppression portion 170A may be provided at the least one location. Accordingly, compared to the first embodiment, it is possible to decrease the number of the suppression portions 170A.

<Third Embodiment of Suppression Portion Preventing Inclination of Image Stabilizing Movable Portion>

Figure 8:
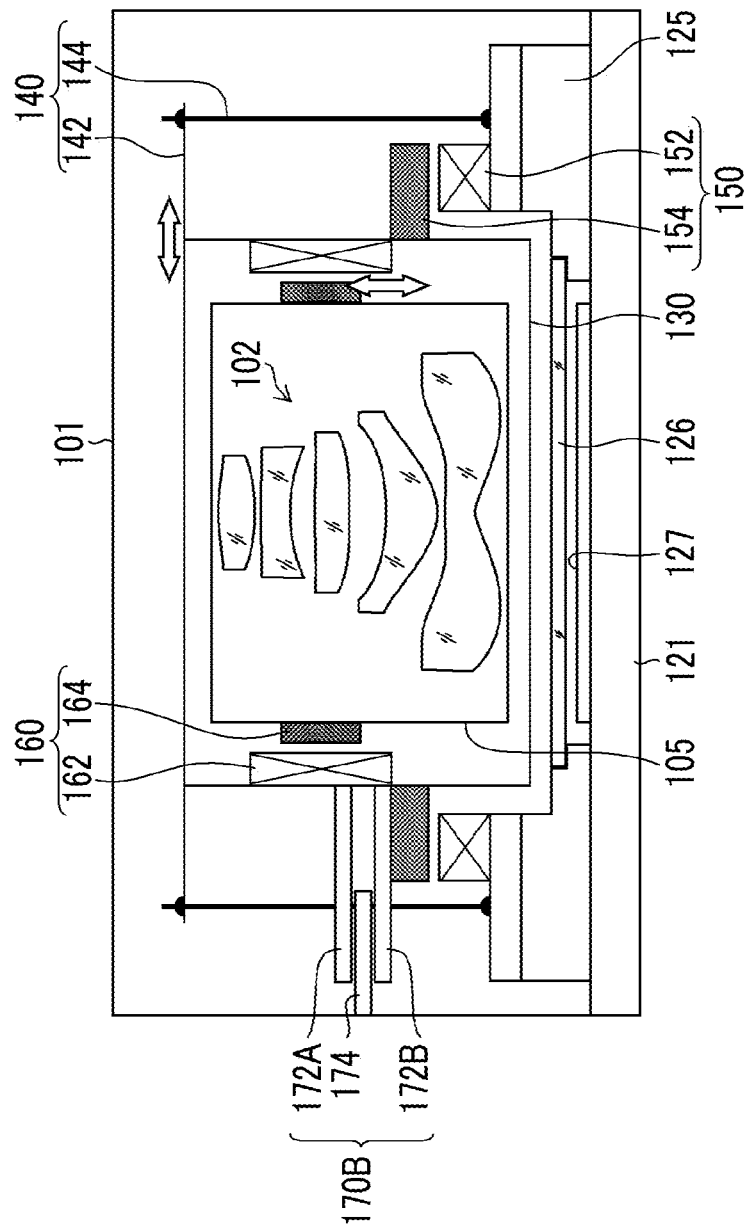
FIG. 8 is a sectional view taken along line A-A of the imaging module shown in FIG. 1, and particularly, is a view showing a third embodiment of the suppression portion which prevents inclination of the image stabilizing movable portion.

FIG. 8 is a sectional view taken along line A-A of the imaging module 100 shown in FIG. 1, and particularly, is a view showing a third embodiment of the suppression portion which prevents the inclination of the image stabilizing movable portion 130. Moreover, in FIG. 8, the same reference numerals are assigned to the portions common to FIG. 3, and detail descriptions thereof are omitted.

A suppression portion 170B of the third embodiment mechanically prevents the inclination of the image stabilizing movable portion 130, and is configured of extension portions 172A and 172B which is provided on the image stabilizing movable portion 130 side (movable side), and the guide portion 174 which is provided on the housing 101 side (fixed side).

Contrary to the second embodiment, in the suppression portion 170B of the third embodiment, the extension portions 172A and 172B are provided on both of the subject side and the imaging element 127 side of the guide portion 174.

An interval between the extension portions 172A and 172B is slightly wider than the thickness of the guide portion 174, and has an interval in which the extension portions 172A and 172B come into contact with the guide portion 174 if the image stabilizing movable portion 130 is inclined beyond the allowable range.

Accordingly, in a case where the imaging module 100 is mounted on an electronic device such as a smart phone, the image stabilizing movable portion 130 is subjected to a magnetic field by which the image stabilizing movable portion 130 is inclined from the magnetic field generation portion inside the electronic device, and the image stabilizing movable portion 130 is inclined beyond the allowable range, the extension portion 172A and 172B extending in the outer circumferential direction of the image stabilizing movable portion 130 abut the guide portion 174. Therefore, it is possible to prevent the image stabilizing movable portion 130 from being inclined beyond the allowable range.

In addition, in the suppression portion 170B of the third embodiment, preferably, the amount of overlap between the extension portion 172A and 172B and the guide portion 174 when viewed from the direction of the optical axis is larger than the maximum movement amount of the image stabilizing movable portion 130. Accordingly, during the image stabilization operation, it is possible to prevent the extension portions 172A and 172B of the image stabilizing movable portion 130 side from falling from the guide portions 174.

Moreover, preferably, low-friction coating is applied to at least one of contact surfaces (surfaces facing each other) of the extension portions 172A and 172B and the guide portion 174.

In the suppression portion 170B of the third embodiment, since the inclination of the extension portions 172A and 172B (that is, the inclination of the image stabilizing movable portion 130) is prevented in the state where the guide portion 174 is interposed between the extension portions 172A and 172B, the suppression portion 170B may be provided at the least one location. Accordingly, compared to the first embodiment, it is possible to decrease the number of the suppression portions 170B.

<Fourth Embodiment of Suppression Portion Preventing Inclination of Image Stabilizing Movable Portion>

Figure 9:
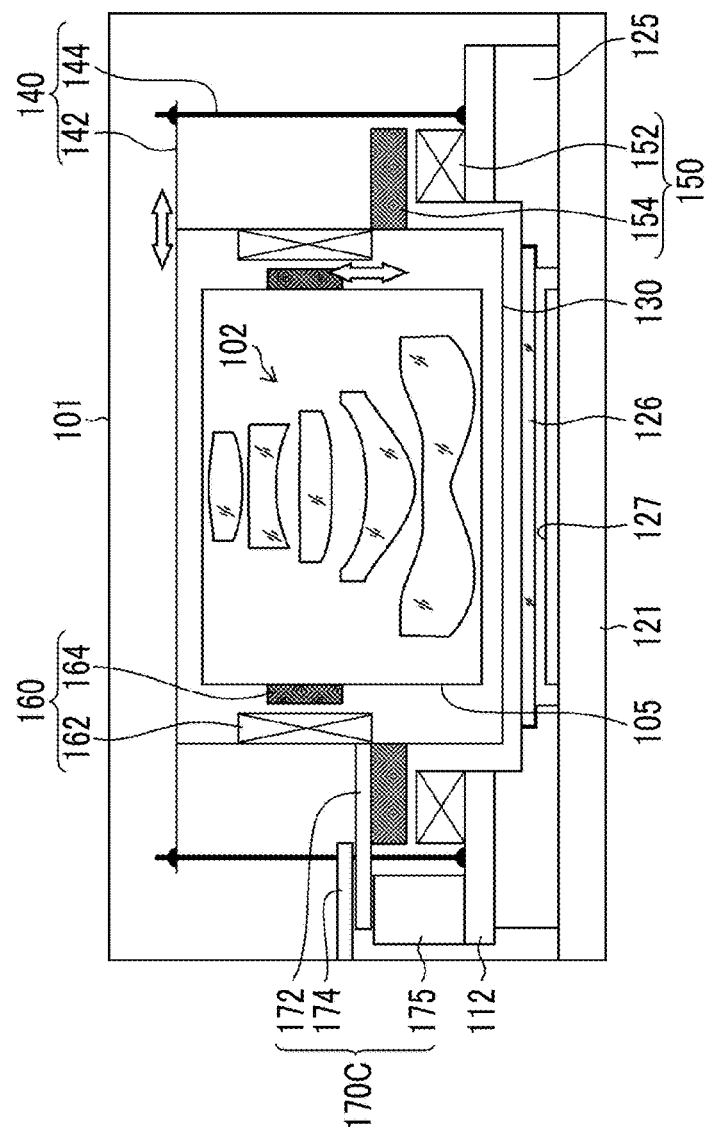
FIG. 9 is a sectional view taken along line A-A of the imaging module shown in FIG. 1, and particularly, is a view showing a fourth embodiment of the suppression portion which prevents inclination of the image stabilizing movable portion.

FIG. 9 is a sectional view taken along line A-A of the imaging module 100 shown in FIG. 1, and particularly, is a view showing a fourth embodiment of the suppression portion which prevents the inclination of the image stabilizing movable portion 130. Moreover, in FIG. 9, the same reference numerals are assigned to the portions common to FIG. 3, and detail descriptions thereof are omitted.

A suppression portion 170C of the fourth embodiment mechanically prevents the inclination of the image stabilizing movable portion 130, and is configured of the extension portion 172 which is provided on the image stabilizing movable portion 130 side, the guide portion 174 which is provided on the housing 101 side, and a guide portion 175 which is erected on the base member 112 of the lens unit 110.

The suppression portion 170C of the fourth embodiment is different from the suppression portion 170A of the second embodiment shown in FIG. 7 in that the guide portions 174 and 175 are provided instead of the guide portions 174A and 174B of the second embodiment.

In the suppression portion 170C of the fourth embodiment, since the guide portion 174 and the guide portion 175 are fixed to the housing 101 and the base member 112 which are separate members, when the housing 101 is finally attached, it is possible to interpose the extension portion 172 between the guide portion 174 and the guide portion 175, and ease of assembly is improved.

<Fifth Embodiment of Suppression Portion Preventing Inclination of Image Stabilizing Movable Portion>

Figure 10:
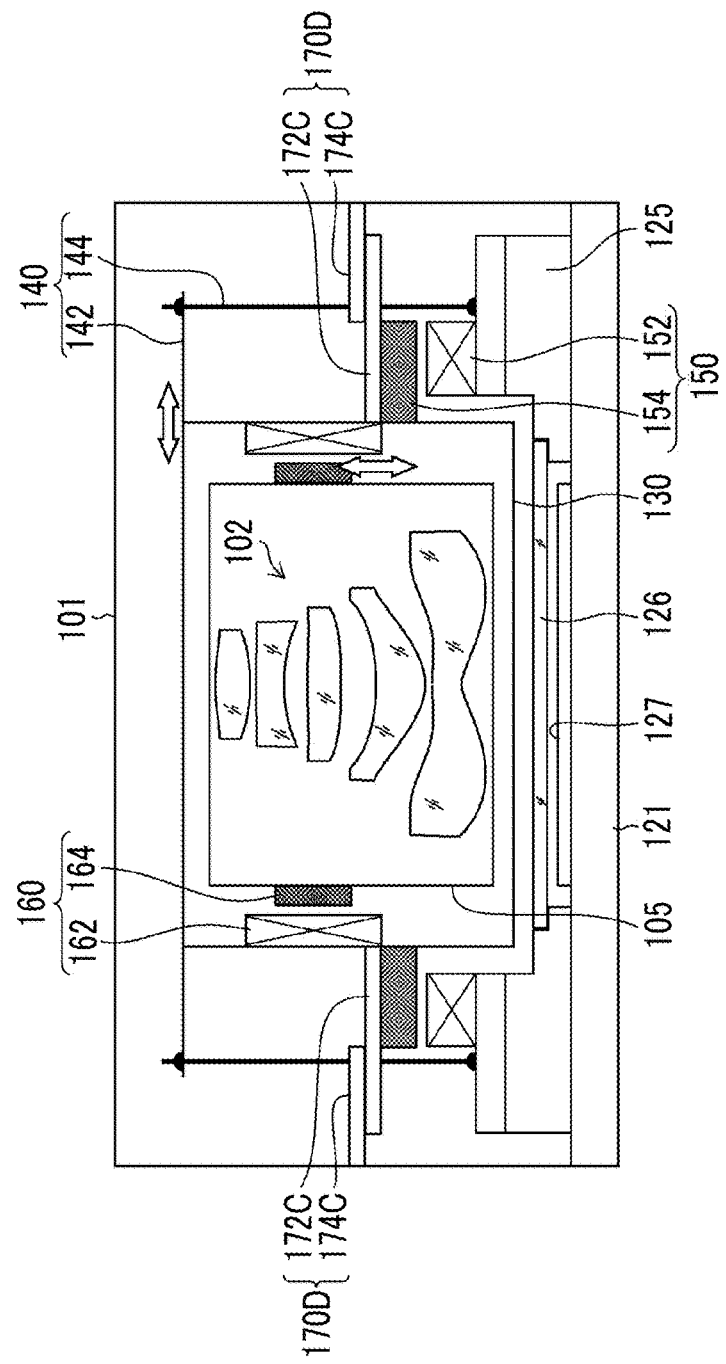
FIG. 10 is a sectional view taken along line A-A of the imaging module shown in FIG. 1, and particularly, is a view showing a fifth embodiment of the suppression portion which prevents inclination of the image stabilizing movable portion.

FIG. 10 is a sectional view taken along line A-A of the imaging module 100 shown in FIG. 1, and particularly, is a view showing a fifth embodiment of the suppression portion which prevents the inclination of the image stabilizing movable portion 130. Moreover, in FIG. 10, the same reference numerals are assigned to the portions common to FIG. 3, and detail descriptions thereof are omitted.

A suppression portion 170D of the fifth embodiment mechanically prevents the inclination of the image stabilizing movable portion 130, and is configured of an extension portion 172C which is provided on the image stabilizing movable portion 130 side, and a guide portion 174C which is provided on the housing 101 side.

The suppression portion 170D of the fifth embodiment is different from the suppression portion 170 of the first embodiment shown in FIG. 3 in that the extension portion 172C and the guide portion 174C normally come into contact with each other.

The image stabilizing movable portion 130 is supported by the elastic support portion 140 so as to be movable in the direction perpendicular to the optical axis of the lens group 102 and to be inclinable around the axis perpendicular to the optical axis. However, for example, in a state where the plate spring 142 is slightly bent, the extension portion 172C abuts the guide portion 174C by the elastic support portion 140, and it is possible to abut the extension portion 172C and the guide portion 174C by a biasing force.

In addition, during the image stabilization operation, in order to decrease resistance when the extension portion 172C and the guide portion 174C slide, preferably, the biasing force applied to the contact surface between the extension portion 172C and the guide portion 174C is the minimum. Moreover, preferably, low-friction coating is applied to at least one of contact surfaces of the extension portion 172C and the guide portion 174C.

In addition, similarly to the suppression portion 170 of the first embodiment shown in FIG. 4, the suppression portions 170D of the fifth embodiment are provided at three locations or more.

<Sixth Embodiment of Suppression Portion Preventing Inclination of Image Stabilizing Movable Portion>

Figure 11:
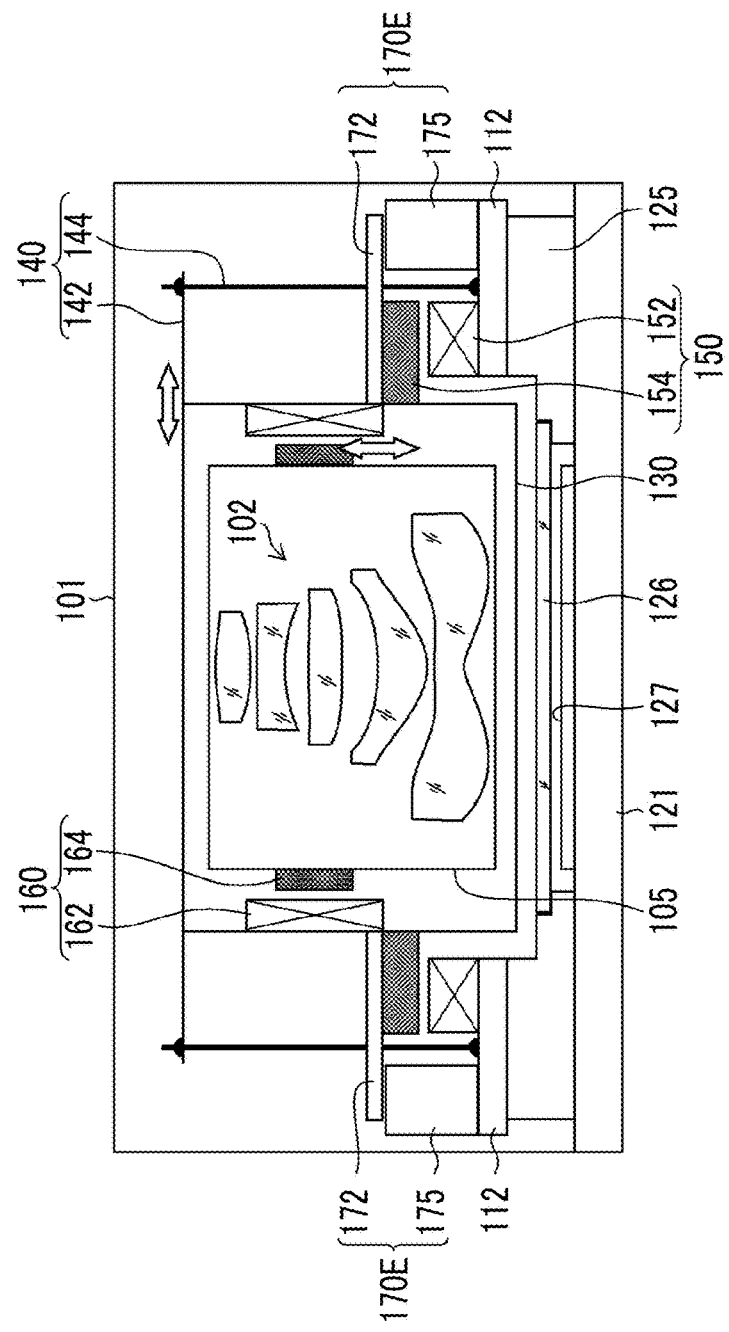
FIG. 11 is a sectional view taken along line A-A of the imaging module shown in FIG. 1, and particularly, is a view showing a sixth embodiment of the suppression portion which prevents inclination of the image stabilizing movable portion.
Figure 12:
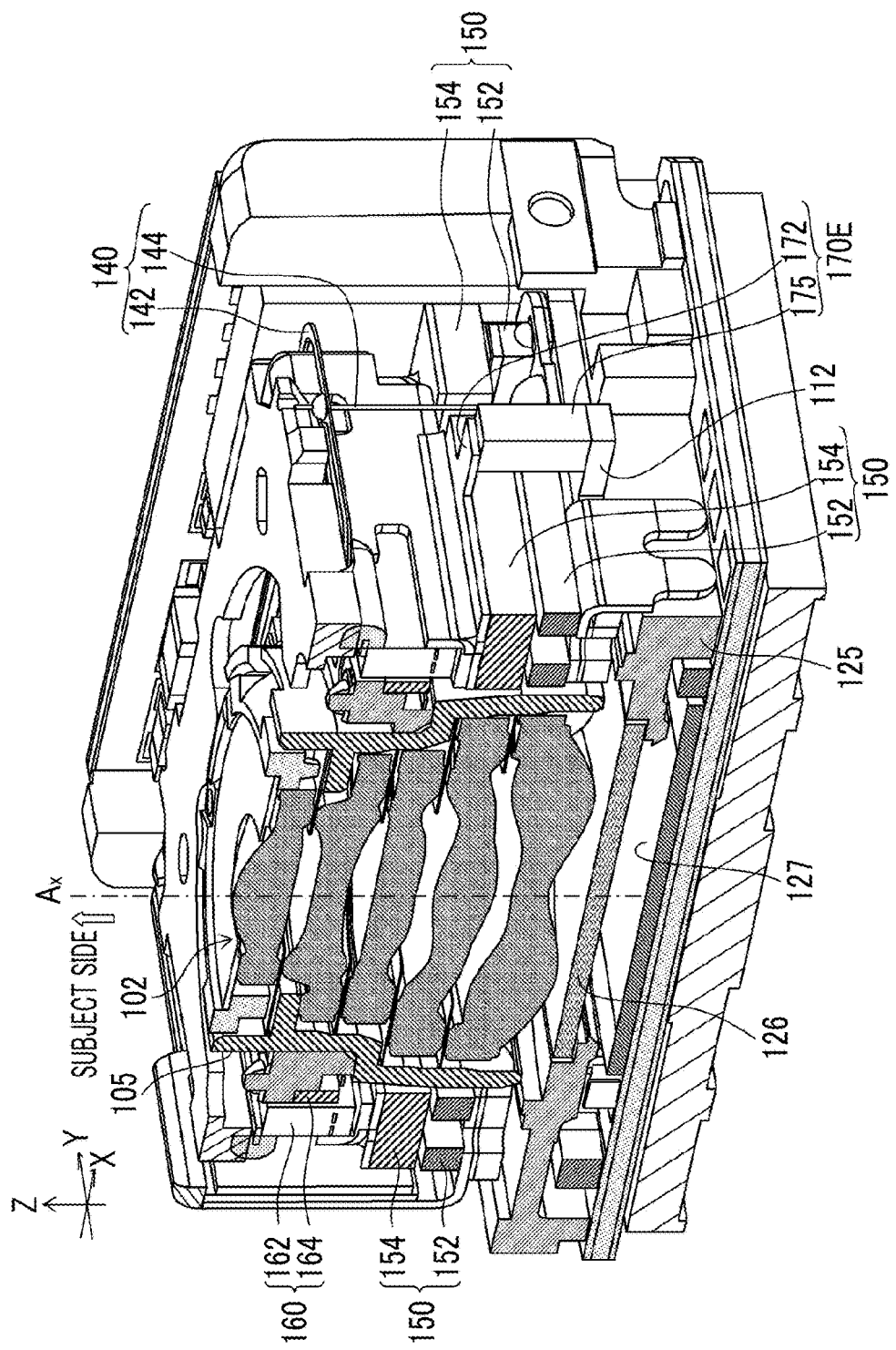
FIG. 12 is a sectional perspective view showing a main portion of the imaging module having the suppression portion of the sixth embodiment.

FIG. 11 is a sectional view taken along line A-A of the imaging module 100 shown in FIG. 1, and particularly, is a view showing a sixth embodiment of the suppression portion which prevents the inclination of the image stabilizing movable portion 130. In addition, FIG. 12 is a sectional perspective view showing a main portion of an imaging module having the suppression portion of the sixth embodiment. Moreover, in FIGS. 11 and 12, the same reference numerals are assigned to the portions common to FIG. 3, and detail descriptions thereof are omitted.

A suppression portion 170E of the sixth embodiment mechanically prevents the inclination of the image stabilizing movable portion 130, and is configured of the extension portion 172 which is provided on the image stabilizing movable portion 130 side, and the guide portion 175 which is erected on the base member 112 of the lens unit.

As shown in FIG. 12, the extension portion 172 can be formed by extending a portion of a magnet holder holding the OIS drive magnet 154 in the direction orthogonal to the optical axis Ax.

Moreover, a portion of the base member 112 of the lens unit extends in the direction orthogonal to the optical axis Ax, and the guide portion 175 is erected on the upper surface of the extension portion of the base member.

The extension portion 172 and the guide portion 175 is provided so as to face each other with a slight gap or to come into contact with each other.

Accordingly, in a case where the imaging module 100 is mounted on an electronic device such as a smart phone, the image stabilizing movable portion 130 is subjected to a magnetic field by which the image stabilizing movable portion 130 is inclined from the magnetic field generation portion inside the electronic device, and the image stabilizing movable portion 130 is inclined, the extension portion 172 extending in the outer circumferential direction of the image stabilizing movable portion 130 abuts the guide portions 175, and the inclination of the image stabilizing movable portion 130 is prevented.

Moreover, preferably, the suppression portions 170E (extension portion 172 and guide portion 175) are provided at three locations or more.

Since the guide portion 175 of the suppression portion 170E is provided on the base member 112 of the lens unit, accuracy on the upper surface of the guide portion 175 is improved.

As the electronic device on which the imaging module 100 having the above-described configuration is mounted, there is a smart phone, a portable phone, a tablet terminal, a personal digital assistant (PDA), a spectacle-type information terminal, a portable game machine, a portable music player, a watch with a camera, or the like. Hereinafter, as an example, a smart phone will be described in detail with reference to the drawings.

<Configuration of Smart Phone>

Figure 13:
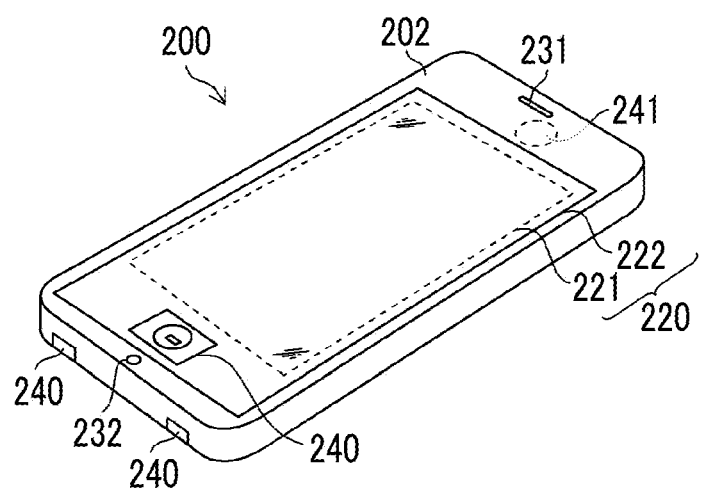
FIG. 13 is a view showing an appearance of a smart phone which is an embodiment of an electronic device.

FIG. 13 is a view showing an appearance of a smart phone 200 on which the imaging module 100 is mounted. The smart phone 200 shown in FIG. 13 has a flat plate-shaped housing 202, and comprises a display input unit 220, in which a display panel 221 serving as a display unit and an operation panel 222 serving as an input unit are integrated with each other, on one surface of the housing 202. In addition, the housing 202 comprises a speaker 231, a microphone 232, an operation unit 240, and a camera unit 241 including the above-described imaging module 100.

In addition, the camera unit 241 is positioned in the vicinity of the speaker 231 which is a magnetic field generation portion, and is disposed on a rear surface side facing a surface of an operation side on which the speaker 231 is disposed. Moreover, the configuration of the housing 202 is not limited to this, and for example, may adopt a configuration in which the display unit and the input unit are independently of each other, or a configuration having a folding structure or a slide mechanism.

Figure 14:
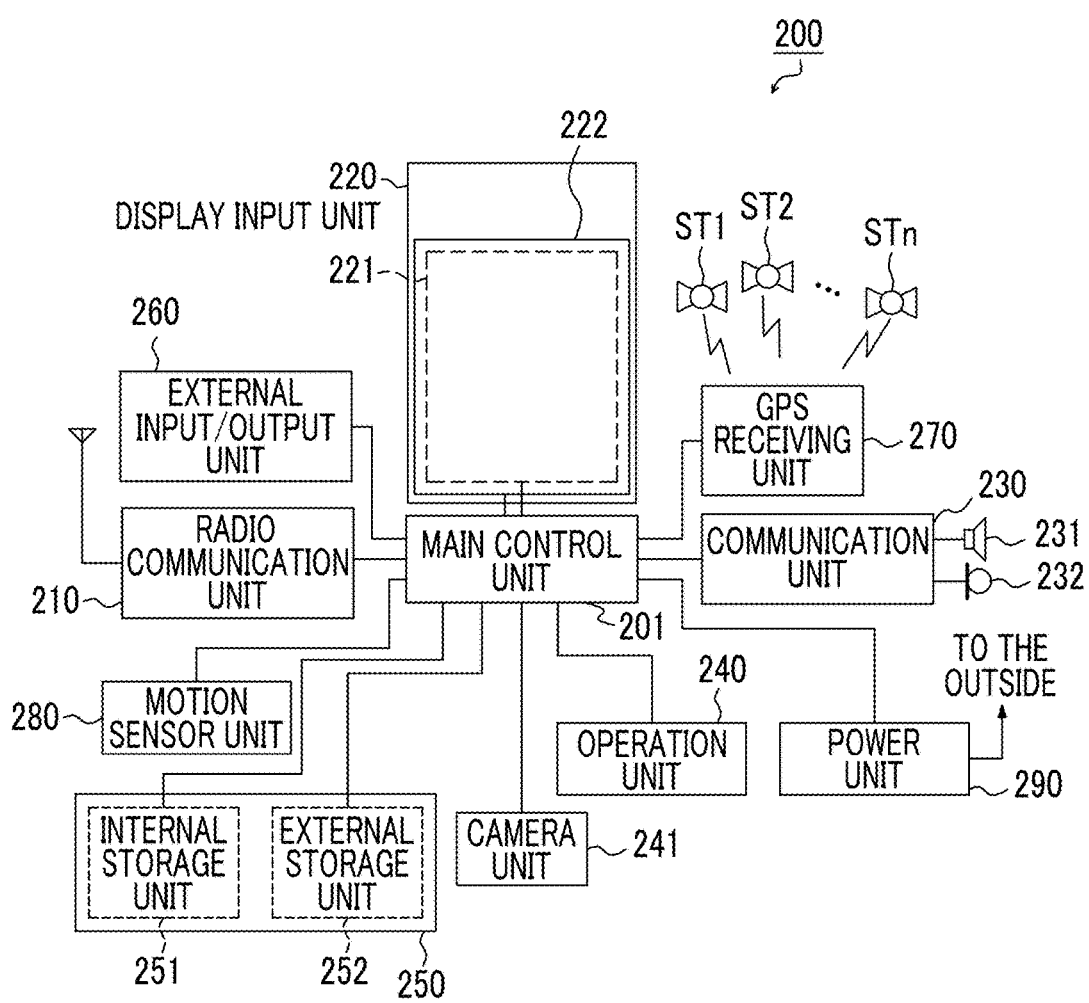
FIG. 14 is a block diagram showing a configuration of the smart phone.

FIG. 14 is a block diagram showing the configuration of the smart phone 200 shown in FIG. 13. As shown in FIG. 14, the smart phone 200 comprises a radio communication unit 210, a display input unit 220, a communication unit 230, the operation unit 240, the camera unit 241, a storage unit 250, an external input/output unit 260, a Global Positioning System (GPS) receiving unit 270, a motion sensor unit 280, a power unit 290, and a main control unit 201, as main components. In addition, the smart phone 200 comprises a radio communication function in which mobile radio communication between the smart phone 200 and a base station apparatus is performed via a mobile communication network, as a main function.

The radio communication unit 210 performs radio communication with respect to the base station apparatus which is accommodated in the mobile communication network, according to instruction of the main control unit 201. Using the radio communication, sending or receiving of various file data such as voice data or image data, electronic mail data, or the like, or receiving of Web data, streaming data, or the like is performed.

The display input unit 220 is a so-called touch panel on which an image (a still picture and a motion picture), character information, or the like is displayed, and through which information is visually transmitted to a user and a user operation with respect to the displayed information is detected by the control of the main control unit 201, and the display input unit 220 comprises the display panel 221 and the operation panel 222. In a case where a user appreciates a generated 3D image, preferably, the display panel 221 is a 3D display panel.

The display panel 221 uses a Liquid Crystal Display (LCD), an Organic Electro-Luminescence Display (OELD), or the like as a display device.

The operation panel 222 is placed so as to view an image displayed on a display surface of the display panel 221, and is a device which detects a coordinate which is operated by a finger or a stylus of a user. If the device is operated by a finger or a stylus of a user, detection signals generated due to the operation are output to the main control unit 201. Sequentially, the main control unit 201 detects the operation position (coordinate) on the display panel 221 based on the received detection signals.

As shown in FIG. 13, the display panel 221 and the operation panel 222 of the smart phone 200 are integrated with each other so as to configure the display input unit 220. However, the operation panel 222 is disposed so as to completely cover the display panel 221. In a case where this disposition is adopted, the operation panel 222 may comprise a function detecting the operation of the user on a region other than the display panel 221. In other words, the operation panel 222 may comprise a detection region (hereinafter, referred to as a display region) with respect to an overlapping portion which overlaps the display panel 221, and a detection region (hereinafter, referred to as a non-display region) with respect to an outer edge portion which does not overlap the display panel 221.

Moreover, the size of the display region and the size of the display panel 221 may completely coincide with each other. However, both necessarily need not coincide with each other. In addition, the operation panel 222 may comprise two sensitive regions such as the outer edge portion and an inner portion except for the outer edge portion. Moreover, a width of the outer edge portion is appropriately designed according to the size of the housing 202 or the like. In addition, as a position detection method which is adopted by the operation panel 222, there is a matrix switch method, a resistance film method, a surface acoustic wave method, an infrared method, an electromagnetic induction method, an electrostatic capacitance method, or the like, and any method may be adopted.

The communication unit 230 includes the speaker 231 or the microphone 232, converts voice of a user input through the microphone 232 into voice data processible by the main control unit 201 and outputs the converted voice to the main control unit 201, or decodes the voice data received by the radio communication unit 210 or the external input/output unit 260 and outputs the decoded voice data from the speaker 231. In addition, as shown in FIG. 13, for example, the speaker 231 and the microphone 232 may be mounted on the same surface as the surface on which the display input unit 220 is provided.

The operation unit 240 is hardware key which uses a key switch or the like, and receives instruction from a user. For example, the operation unit 240 is mounted on the lower portion and the lower surface of the display unit of the housing 202 of the smart phone 200, and a button type switch which is turned on if the switch is pressed by a finger or the like and is turned off by a restoring force of a spring or the like if a finger is separated from the switch.

The storage unit 250 stores a control program or control data of the main control unit 201, address data associated with names or telephone numbers of communication partners, data of transmitted and received electronic mails, Web data downloaded by Web browsing, or downloaded content data, and temporarily stores streaming data. Moreover, the storage unit 250 is configured of an internal storage unit 251 built in the smart phone, and an external storage unit 252 having an external memory slot which is attachable and detachable. In addition, each of the internal storage unit 251 and the external storage unit 252 configuring the storage unit 250 is realized using a storage medium such as a flash memory type storage medium, a hard disk type storage medium, a multimedia card micro-type storage medium, a card type memory (for example, MicroSD (registered trademark) memory), a Random Access Memory (RAM), or a Read Only Memory (ROM).

The external input/output unit 260 takes a role of an interface between the smart phone 200 and all external devices connected to the smart phone 200, and is directly or indirectly connected to other external devices via communication or the like (for example, universal serial bus (USB), IEEE1394, or the like), or a network (for example, internet, wireless LAN, Bluetooth (registered trademark), Radio Frequency Identification (RFID), Infrared Data Association (IrDA) (registered trademark), Ultra Wideband (UWB) (registered trademark), ZigBee (registered trademark), or the like).

As the external device connected to the smart phone 200, for example, there is wire/wireless headsets, wire/wireless external chargers, wire/wireless data ports, a Memory Card or a Subscriber Identity Module (SIM) card/a User Identity Module (UIM) card connected via a card socket, external audio/video devices connected via audio and video Input/

Output (I/O) terminal, external audio/video device wirelessly connected, a smart phone which is connected by a wired or wireless manner, a personal computer which is connected by a wired or wireless manner, a PDA or earphone which is connected by a wired or wireless manner, or the like. The external input/output unit can transmit data received from the external devices to each component inside the smart phone 200, or can transmit data inside the smart phone 200 to the external devices.

The GPS receiving unit 270 receives GPS signals transmitted from GPS satellites ST1 to STn according to the instruction of the main control unit 201, performs measurement calculation processing based on the plurality of received GPS signals, and detects the position of the smart phone 200 consisted of latitude, longitude, and altitude of the smart phone 200. When the GPS receiving unit 270 can acquire position information from the radio communication unit 210 or the external input/output unit 260 (for example, wireless LAN), the GPS receiving unit 270 may detect the position using the position information.

For example, the motion sensor unit 280 comprises a triaxial acceleration sensor or the like, and detects a physical movement of the smart phone 200 according to the instruction of the main control unit 201. By detecting the physical movement of the smart phone 200, a movement direction or acceleration of the smart phone 200 is detected. The detection results are output from the main control unit 201.

The power unit 290 supplies electric power accumulated in a battery (not shown) to each portion of the smart phone 200 according to the instruction of the main control unit 201.

The main control unit 201 comprises a microprocessor, is operated according to the control program or the control data stored in the storage unit 250, and integrally controls respective portions of the smart phone 200. Moreover, the main control unit 201 comprises a mobile communication control function which controls each portion of a communication system, and an application processing function in order to perform voice communication or data communication via the radio communication unit 210.

The application processing function is realized by operating the main control unit 201 according to application software stored in the storage unit 250. For example, as the application processing function, there is an infrared communication function which performs data communication with an opposing device by controlling the external input/output unit 260, an electronic mail function which performs sending and receiving of an electronic mail, a Web browsing function which browses a Web page, or the like.

Moreover, the main control unit 201 comprises an image processing function such as displaying images on the display input unit 220 based on image data (data of still picture or motion picture) such as the received data or the downloaded streaming data. The image processing function means a function in which the image data is decoded by the main control unit 201, image processing is performed on the decoded result, and the image is displayed on the display input unit 220.

Moreover, the main control unit 201 performs a display control with respect to the display panel 221, and performs an operation detection control which detects a user operation through the operation unit 240 and the operation panel 222.

By performing the display control, the main control unit 201 displays an icon for starting application software or a software key such as a scroll bar, or displays a window for preparing an electronic mail. In addition, the scroll bar indicates a software key for receiving instruction of moving a display portion of a large image or the like which cannot be completely received in the display region of the display panel 221.

Moreover, by performing the operation detection control, the main control unit 201 detects a user operation through the operation unit 240, receives the operation with respect to the icon or the input of a character string with respect to an input box of the window through the operation panel 222, or receives a scroll request of the display image through the scroll bar.

In addition, by performing the operation detection control, the main control unit 201 comprises a touch panel control function which determines whether the operation position with respect to the operation panel 222 is positioned at the overlapping portion (display region) overlapping the display panel 221 or at the outer edge portion (non-display region) which does not overlap the display panel 221, and controls the sensitive region of the operation panel 222 or the display position of the software key.

In addition, the main control unit 201 detects a gesture operation with respect to the operation panel 222, and may perform a preset function according to the detected gesture operation. The gesture operation does not mean a simple touch operation in the related art, and means drawing a locus using a finger or the like, simultaneously designating a plurality of positions, or drawing a locus with respect to at least one position from the plurality of positions by combining the drawing and the designating.

The camera unit 241 is a digital camera which performs electronic imaging using an imaging element such as a Complementary Metal Oxide Semiconductor (CMOS) or a Charge-Coupled Device (CCD). The above-described imaging module 100 is applied to the camera unit 241.

Moreover, in the camera unit 241, for example, image data obtained by imaging is converted into compressed image data such as Joint Photographic coding Experts Group (JPEG) by the control of the main control unit 201, and the compressed image data can be recorded on the storage unit 250 or can be output through the external input/output unit 260 or the radio communication unit 210. As shown in FIG. 13, in the smart phone 200, the camera unit 241 is mounted on a rear surface facing the display input unit 220. However, the mounting position of the camera unit 241 is not limited to this, and the camera unit 241 may be mounted on the same surface as the display input unit 220 or a plurality of camera units 241 may be mounted. Moreover, in a case where the plurality of camera units 241 are mounted, it is switched to the camera unit 241 which performs the imaging, only the camera unit 241 can perform the imaging, or the plurality of camera units 241 can be simultaneously used so as to perform the imaging.

In addition, the camera unit 241 can be used in various functions of the smart phone 200. For example, the image acquired by the camera unit 241 can be displayed on the display panel 221, or the image of the camera unit 241 can be used as one of operation inputs of the operation panel 222. In addition, when the GPS receiving unit 270 detects the position, it is possible to detect the position with reference to the image from the camera unit 241. Moreover, it is possible to determine the direction of the optical axis of the camera unit 241 of the smart phone 200 or a current use environment with reference to the image from the camera unit 241 without using the triaxial acceleration sensor or using the triaxial acceleration sensor together. Of course, it is possible to use the image from the camera unit 241 within the application software.

[Others]

In the OIS mechanism of the present embodiment, the OIS drive coil is disposed on the base member side (fixed side), and the OIS drive magnet is disposed on the image stabilizing movable portion side (movable side). However, contrary to this, the OIS drive magnet may be disposed on the base member side and the OIS drive coil may be disposed on the image stabilizing movable portion side.

Moreover, the lens group is not limited to the configuration in which the lens group is configured of five lenses, and various lenses may be applied.

In addition, the present invention is not limited to the above-described embodiments, and it is needless to say that various modifications may be applied to the present invention within a scope which does not depart from the gist of the present invention.

EXPLANATION OF REFERENCES

100 . . . imaging module, 101 . . . housing, 102 . . . lens group, 103, 122 . . . flexible substrate, 114 . . . lens unit terminal portion, 105 . . . lens barrel, 110 . . . lens unit, 112, 125 . . . base member, 120 . . . imaging element unit, 121 . . . substrate, 126 . . . cover glass, 127 . . . imaging element, 130 . . . image stabilizing movable portion, 140 . . . elastic support portion, 142 . . . plate spring, 144 . . . suspension wire, 150 . . . OIS mechanism, 150A, 150C, 160E . . . voice coil motor, 152 . . . OIS drive coil, 154 . . . OIS drive magnet, 160 . . . focus adjustment mechanism, 162 . . . AF coil, 164 . . . AF magnet, 170, 170A, 170B, 170C, 170D, 170E . . . suppression portion, 172, 172A, 172B, 172C . . . extension portion, 174, 174A, 174B, 174C, 175 . . . guide portion, 200 . . . smart phone

What is claimed is:

1. An imaging module, comprising:
an image stabilizing movable portion which has a lens group and a magnetic member;
an imaging element which images a subject through the lens group;
an elastic support portion which supports the image stabilizing movable portion so as to be movable in a direction perpendicular to an optical axis of the lens group and to be inclinable around an axis perpendicular to the optical axis; and
a suppression portion which mechanically prevents inclination of the image stabilizing movable portion,
wherein the suppression portion has,
an extension portion which is provided in the image stabilizing movable portion and extends in an outer circumferential direction of the image stabilizing movable portion, and
a guide portion which overlaps the extension portion when viewed from the direction of the optical axis, and prevents inclination of the image stabilizing movable portion by coming into contact with the extension portion,
wherein the guide portions are provided on both of the subject side and the imaging element side of the extension portion.

2. The imaging module according to claim 1,
wherein an amount of overlap between the extension portion and the guide portion when viewed from the direction of the optical axis has a size which is overlapped therebetween even when the image stabilizing movable portion moves by a maximum movement amount.

3. The imaging module according to claim 2,
wherein the extension portions and the guide portions are provided at three locations or more.

4. The imaging module according to claim 3,
wherein the extension portion and the guide portion normally come into contact with each other in a state where the image stabilizing movable portion is driven.

5. The imaging module according to claim 4,
wherein a low-friction coating is applied to at least one surface of contact surfaces on which the extension portion and the guide portion come into contact with each other.

6. The imaging module according to claim 3,
wherein a low-friction coating is applied to at least one surface of contact surfaces on which the extension portion and the guide portion come into contact with each other.

7. The imaging module according to claim 2,
wherein the extension portion and the guide portion normally come into contact with each other in a state where the image stabilizing movable portion is driven.

8. The imaging module according to claim 7,
wherein a low-friction coating is applied to at least one surface of contact surfaces on which the extension portion and the guide portion come into contact with each other.

9. The imaging module according to claim 1,
wherein the extension portions and the guide portions are provided at three locations or more.

10. The imaging module according to claim 9,
wherein the extension portion and the guide portion normally come into contact with each other in a state where the image stabilizing movable portion is driven.

11. The imaging module according to claim 10,
wherein a low-friction coating is applied to at least one surface of contact surfaces on which the extension portion and the guide portion come into contact with each other.

12. The imaging module according to claim 9,
wherein a low-friction coating is applied to at least one surface of contact surfaces on which the extension portion and the guide portion come into contact with each other.

13. The imaging module according to claim 1,
wherein the extension portion and the guide portion normally come into contact with each other in a state where the image stabilizing movable portion is driven.

14. The imaging module according to claim 13,
wherein a low-friction coating is applied to at least one surface of contact surfaces on which the extension portion and the guide portion come into contact with each other.

15. The imaging module according to claim 1,
wherein a low-friction coating is applied to at least one surface of contact surfaces on which the extension portion and the guide portion come into contact with each other.

16. The imaging module according to claim 1,
wherein the image stabilizing movable portion has a voice coil motor which drives the lens group in the direction of the optical axis.

17. The imaging module according to claim 1, wherein the elastic support portion is configured of a plate spring which extends to the side of the image stabilizing movable portion, and three or more suspension wires of which one end is fixed to the plate spring and the other end is fixed to the imaging element side.

18. The imaging module according to claim 1,
wherein a pixel pitch of the imaging element is 1 μm or less.

19. An electronic device comprising:
the imaging module according to claim 1 mounted thereon.

20. The electronic device according to claim 19,
wherein the electronic device has a magnetic field generation portion which generates a magnetic field by which the image stabilizing movable portion is inclined.

\* \* \* \* \*